(12) United States Patent
Sakaguchi

(10) Patent No.: US 10,205,127 B2
(45) Date of Patent: Feb. 12, 2019

(54) ORGANIC EL PANEL-USE TRANSPARENT RESIN LAYER, ORGANIC EL PANEL, ORGANIC EL LIGHTING DEVICE, AND ORGANIC EL DISPLAY

(71) Applicant: NEC LIGHTING, LTD., Minato-ku, Tokyo (JP)

(72) Inventor: Yoshikazu Sakaguchi, Tokyo (JP)

(73) Assignee: NEC LIGHTING, LTD., Tokyo (JP)

( * ) Notice: Subject to any disclaimer, the term of this patent is extended or adjusted under 35 U.S.C. 154(b) by 0 days.

(21) Appl. No.: 15/322,496

(22) PCT Filed: Apr. 17, 2015

(86) PCT No.: PCT/JP2015/061879
§ 371 (c)(1),
(2) Date: Dec. 28, 2016

(87) PCT Pub. No.: WO2016/002310
PCT Pub. Date: Jan. 7, 2016

(65) Prior Publication Data
US 2017/0125737 A1 May 4, 2017

(30) Foreign Application Priority Data
Jul. 4, 2014 (JP) ................................. 2014-138652

(51) Int. Cl.
*H01L 51/52* (2006.01)
*G02B 5/02* (2006.01)

(52) U.S. Cl.
CPC ........ *H01L 51/5268* (2013.01); *G02B 5/0221* (2013.01); *G02B 5/0236* (2013.01);
(Continued)

(58) Field of Classification Search
CPC ............. H01L 51/5268; H01L 51/5206; H01L 2251/5369; G02B 5/0242; G02B 5/0236
See application file for complete search history.

(56) References Cited

U.S. PATENT DOCUMENTS

2005/0142379 A1 6/2005 Juni et al.
2008/0012477 A1* 1/2008 Koo .................. H01L 51/529
313/504
(Continued)

FOREIGN PATENT DOCUMENTS

JP 2005-190931 A 7/2005
JP 2006-236748 A 9/2006
(Continued)

OTHER PUBLICATIONS

International Search Report for PCT Application No. PCT/JP2015/061879, dated Jun. 9, 2015.

*Primary Examiner* — Nathan L Van Sell

(57) ABSTRACT

To provide a transparent resin layer for use in an organic EL panel, capable of solving a problem with light extraction efficiency caused by the wavelength dependency (wavelength dispersion) of the refractive index of light. A transparent resin layer 12 for use in an organic EL panel includes: a transparent resin 121; and first fine particles 122 having an average particle diameter from 300 to 50000 nm and second fine particles 123 having an average particle diameter from 1 to 300 nm dispersed in the transparent resin 121, and the fine particles have a function as at least either a light scattering material or a light-dispersing material. Alternatively, a transparent resin layer 42 for use in an organic EL panel includes a transparent resin 421 having an uneven structure, the uneven structure includes first projections 422 in which at least either the widths or the heights are from 300 to 1000 nm and second projections 423 in which at least either the widths or the heights are from 10 to 300 nm, and at least either the shapes or the sizes of the projections in the uneven structure have no periodicity.

10 Claims, 6 Drawing Sheets

(52) U.S. Cl.
CPC .......... *G02B 5/0242* (2013.01); *H01L 51/524* (2013.01); *H01L 51/5206* (2013.01); *H01L 2251/5369* (2013.01)

(56) References Cited

U.S. PATENT DOCUMENTS

| | | |
|---|---|---|
| 2009/0052195 A1 | 2/2009 | Saneto et al. |
| 2011/0200293 A1* | 8/2011 | Zhang .................... B82Y 20/00 385/131 |
| 2012/0038876 A1* | 2/2012 | Lee .................... C09K 19/2007 349/175 |
| 2012/0305966 A1 | 12/2012 | Shin |
| 2013/0331474 A1 | 12/2013 | Kida et al. |
| 2014/0014923 A1* | 1/2014 | Jang .................... H01L 51/5268 257/40 |

FOREIGN PATENT DOCUMENTS

| | | |
|---|---|---|
| JP | 2009-110930 A | 5/2009 |
| JP | 2012-028307 A | 2/2012 |
| JP | 2013-138018 A | 7/2013 |
| JP | 2014-017233 A | 1/2014 |
| WO | 2011/093120 A1 | 8/2011 |
| WO | WO-2012033322 A3 * | 5/2012 ......... H01L 51/5268 |

* cited by examiner

ORGANIC EL PANEL-USE TRANSPARENT RESIN LAYER, ORGANIC EL PANEL, ORGANIC EL LIGHTING DEVICE, AND ORGANIC EL DISPLAY

This application is a National Stage Entry of PCT/JP2015/061879 filed on Apr. 17, 2015, which claims priority from Japanese Patent Application 2014-138652 filed on Jul. 4, 2014, the contents of all of which are incorporated herein by reference, in their entirety.

TECHNICAL FIELD

The present invention relates to a transparent resin layer for use in an organic EL panel, an organic EL panel, an organic EL lighting device, and an organic EL display.

BACKGROUND ART

An organic EL element for use in an organic electroluminescence (EL) panel can be produced by forming a layer of an organic EL material (organic EL layer) on a light-transmitting substrate.

The organic EL panel has low extraction efficiency of light emitted from the organic EL layer. There are some causes for the problem. The first cause is that light emitted from the organic EL layer has no directivity and is dissipated in all directions and thus extracted to the front side of the organic EL panel in small amount. The second cause is that the emitted light is totally reflected at the interfaces between the layers in the organic EL panel and thus is not extracted to the outside of the organic EL panel.

The cross-sectional view of FIG. 11 schematically illustrates an example of the problem and the causes. Hatches are not shown in the cross-sectional view of FIG. 11 for visibility. As shown in FIG. 11, the organic EL panel of FIG. 11 includes: a transparent substrate 11; and a transparent electrode (anode) 14; an organic EL layer 16; and a cathode 15 laminated on one surface of the transparent substrate 11 in this order. The transparent substrate 11 is formed of, for example, glass. The transparent electrode 14 is formed of, for example, Indium-Tin Oxide (ITO). The cathode 15 is formed of, for example, a metal. The light emitted from the organic EL layer 16 includes emitted light beams 101 and 102 in the direction orthogonal to the organic EL panel (the direction orthogonal to the transparent substrate 11) or a direction close thereto and emitted light beams 103 and 104 in the direction largely tilted with respect to the orthogonal direction. The emitted light beams 101 and 102 are not totally reflected at the interfaces between the layers in the organic EL panel, are extracted to the outside of the organic EL panel through the transparent substrate 11, and are then visually identified. The emitted light beams 103 and 104 are totally reflected at the interfaces between the transparent substrate 11 and the transparent electrode 14, between the organic EL layer 16 and the cathode 15, and between the transparent substrate 11 and the atmosphere and are not extracted to the outside of the organic EL panel. This is because, for example, in light transmission through the transparent electrode 14, the transparent substrate 11, and the atmosphere in this order, a critical angle due to the differences in refractive index between the layers is generated. For example, the transparent electrode 14 formed of ITO has a refractive index of about 1.9, the transparent substrate 11 formed of glass (for example, soda-lime glass, nonalkali glass) has a refractive index of about 1.5, and the atmosphere has a refractive index of about 1.0. The differences in refractive index are large. The light entered at the critical angle or more is therefore totally reflected at the interfaces between the layers and is repeatedly multiply reflected between each layer and the cathode 15, and cannot be extracted to the atmosphere.

In order to solve this problem, scattering and diffusion of light emitted from the organic EL layer is controlled by providing a layer containing fine particles on the light-transmitting substrate (for example, Patent Documents 1 to 3).

PRIOR ART DOCUMENTS

Patent Document

Patent Document 1: WO 2011/093120
Patent Document 2: JP 2013-138018 A
Patent Document 3: JP 2005-190931 A

SUMMARY OF INVENTION

Problem to be Solved by the Invention

The methods described in Patent Documents 1 to 3 however have a problem with light extraction efficiency caused by the wavelength dependency (wavelength dispersion) of the refractive index of light. The cross-sectional view of FIG. 12 schematically illustrates this problem. Hatches are not shown in the cross-sectional view of FIG. 12 for visibility.

The organic EL panel of FIG. 12 has the same structure as in the organic EL panel of FIG. 11 as shown in FIG. 12. Emitted light beams 111, 112, and 113 in the direction orthogonal to the organic EL panel (the direction orthogonal to the transparent substrate 11) or a direction close thereto are not totally reflected as in FIG. 11. These emitted light beams are extracted to the outside of the organic EL panel through the transparent substrate 11 and are then visually identified. The shorter the wavelengths of emitted light beams in a direction largely tilted with respect to the orthogonal direction are, the more difficult the extraction of the emitted light beams to the outside of the organic EL panel becomes. This is because the critical angle at which the total reflection occurs differs depending on the wavelength of light due to the wavelength dependency (wavelength dispersion) of the refractive index of light, i.e., the phenomenon where the refractive index of light differs depending on the wavelength of light. More specifically, the shorter the wavelength of light is, the larger the refractive index of the light is, and the higher the proportion of the totally reflected light. For example, as shown in FIG. 12, red light 114 and green light 115 transmit through the interface between the transparent electrode 14 and the transparent substrate 11 and are refracted, and blue light 116 is totally reflected even when the red light 114, the green light 115, and the blue light 116 are extracted in the same direction at the same angle. On the other hand, red light 117 and green light 118 transmit through the interface between the transparent substrate 11 and the atmosphere and are extracted to the outside of the organic EL panel, and blue light 119 is totally reflected at the interface and is not extracted to the organic EL panel. The blue light 116 and the blue light 119 are repeatedly totally reflected between each layer and the cathode (metal electrode) 15 and is confined (not shown) within the organic EL panel.

As described above, the light at a shorter wavelength is more prone to be confined within the commonly-used organic EL panel and is prone to be guided to the edge. This problem may result in, for example, color unevenness in a display of the commonly-used organic EL panel. The color unevenness in a display is, for example, a phenomenon where the edge of the organic EL panel appears to be bluish compared with the center. This problem may also result in a lighting panel having a lower color temperature than originally designed color temperature in the case of using the commonly-used organic EL panel as a light source and the difference appearance of the color temperature in the case of viewing the commonly-used organic EL panel from an oblique angle. Furthermore, in the commonly-used organic EL panel, light in a short wavelength region is not extracted to the outside, and the light emission efficiency is reduced thereby. This may result in an increase in power consumption.

Hence, the present invention is intended to provide a transparent resin layer for use in an organic EL panel, capable of solving the problem with light extraction efficiency caused by the wavelength dependency (wavelength dispersion) of the refractive index of light, an organic EL panel, an organic EL lighting device, and an organic EL display.

Means for Solving Problem

In order to achieve the aforementioned object, the present invention provides a first transparent resin layer for use in an organic EL panel, including:
  a transparent resin; and
  a plurality of light-scattering particles dispersed in the transparent resin, wherein
    the plurality of light-scattering fine particles comprises:
    a first fine particle group comprising light-scattering particles having an average particle diameter from 300 to 50000 nm; and
    a second fine particle group comprising light-scattering particles having an average particle diameter from 1 to 300 nm.

The present invention further provides a second transparent resin layer for use in an organic EL panel, including:
  a transparent resin; and
  an uneven structure formed in the transparent resin, the uneven structure comprising a plurality of projections, wherein
    the plurality of projections comprises:
    a first projection group comprising projections, at least either widths or the heights of the projections of the first projection group being in the range from 300 to 3000 nm, and
    a second projection group comprising projections, at least either the widths or the heights of the projections of the second projection group being in the range from 10 to 300 nm, and
    at least either the shapes or the sizes of the plurality of projections in the uneven structure have no periodicity.

The present invention further provides an organic EL panel including:
  a substrate; and
  either one the first transparent resin layer or the second transparent resin layer (hereinafter collectively also referred to as "the transparent resin layer of the present invention"), wherein
    the transparent resin layer is laminated on at least one surface of the substrate.

The present invention further provides an organic EL lighting device including: the transparent resin layer of the present invention, for use in an organic EL lighting panel; or the organic EL panel of the present invention being an organic EL lighting panel including the transparent resin layer.

The present invention further provides an organic EL display including the transparent resin layer of the present invention, for use in an organic EL display panel; or the organic EL panel of the present invention being an organic EL display panel including the transparent resin layer.

Effects of the Invention

The transparent resin layer for use in an organic EL panel, an organic EL panel, an organic EL lighting device, and an organic EL display of the present invention can solve the problem with light extraction efficiency caused by the wavelength dependency (wavelength dispersion) of the refractive index of light.

DESCRIPTION OF EMBODIMENTS

Figure 1:
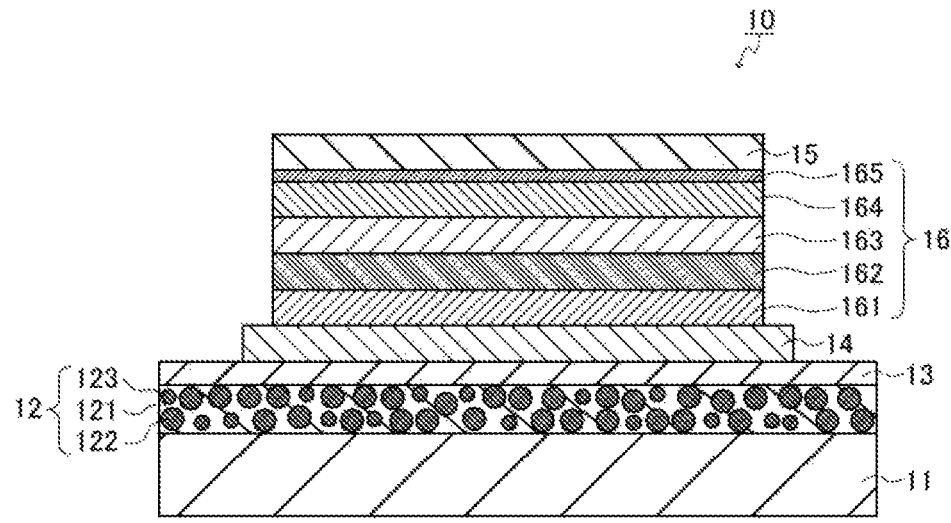
FIG. 1 is a cross-sectional view schematically illustrating a structure of the organic EL panel according to an embodiment of the present invention.

The following describes the present invention in detail with reference to embodiments. The present invention, however, is by no means limited thereto. In the drawings, the structure of each component may be shown in a simplified form as appropriate for the sake of convenience in illustration, and also, each component may be shown schematically with a dimension ratio different from the actual dimension ratio.

[First Embodiment]

The following describes a first embodiment of the present invention.

The first embodiment describes the first transparent resin layer of the present invention; and an organic EL panel obtained by disposing the transparent resin layer between a substrate and a transparent electrode.

Figure 9:
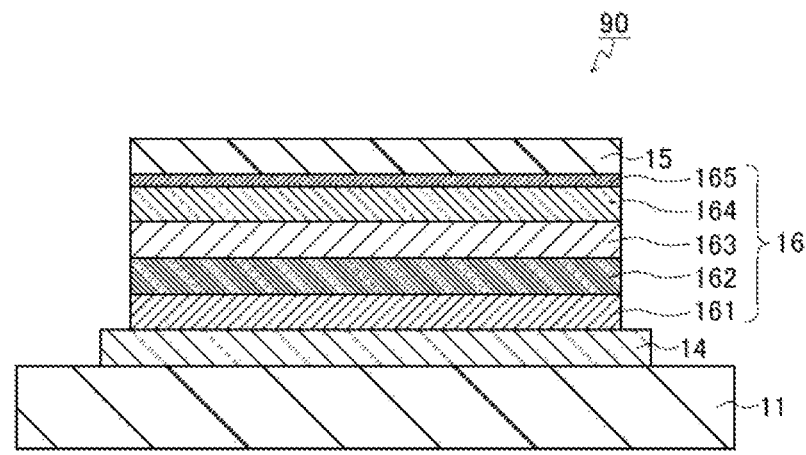
FIG. 9 is a cross-sectional view schematically illustrating an example structure of a commonly-used organic EL panel.

The cross-sectional view of FIG. 9 schematically illustrates an example structure of commonly-used organic EL panel. As shown in FIG. 9, this organic EL panel 90 includes: a transparent substrate 11; and a transparent electrode (anode 14); an organic EL layer 16; and a cathode 15 laminated on one surface of the transparent substrate 11 in this order. The transparent substrate 11 is formed of, for example, glass. The transparent electrode 14 is formed of, for example, ITO. The cathode 15 is formed of, for example, a metal. The organic EL layer 16 includes: a hole injection layer 161; a hole transport layer 162; a light-emitting layer 163; an electron transport layer 164, and an electron injection layer 165 laminated in this order from the transparent electrode 14 side toward the cathode 15 side.

The cross-sectional view of FIG. 1 schematically illustrates a structure of an organic EL panel according to the present embodiment. As shown in FIG. 1, this organic EL panel 10 includes: a transparent substrate 11; and a transparent resin layer 12 for use in an organic EL panel; a planarizing layer 13; a transparent electrode (anode 14); an organic EL layer 16; and a cathode 15 laminated in this order on one surface of the transparent substrate 11. The transparent substrate 11 is formed of, for example, glass. The transparent electrode 14 is formed of, for example, ITO. The cathode 15 is formed of, for example, a metal. The organic EL layer 16 includes: a hole injection layer 161; a hole transport layer 162; a light-emitting layer 163; an electron transport layer 164; and an electron injection layer 165 laminated in this order from the transparent electrode 14 side toward the cathode 15 side.

The transparent resin layer for use in an organic EL panel (hereinafter also merely referred to as the "transparent resin layer") 12 is formed by dispersing a plurality of light-scattering fine particles (hereinafter also merely referred to as the "fine particles" in a transparent resin (hereinafter also referred to as the "binder resin" or the "matrix resin") 121. The plurality of light-scattering fine particles includes a first fine particle group composed of a plurality of first fine particles 122 and a second fine particle group composed of a plurality of second fine particles 123. Each of the first fine particles 122 and the second fine particles 123 functions as a light-scattering material. It should be noted that the concept of the light "scattering" includes "dispersion" and "diffusion" of light. The first fine particles 122 have an average particle diameter from 300 to 50000 nm. The second fine particles 123 have an average particle diameter from 1 to 300 nm. That is, the transparent resin layer 12 is a first transparent resin layer for use in an organic EL panel" of the present invention.

The transparent resin (binder resin) 121 is not limited to particular resins, and examples thereof include polyester such as polyethylene terephthalate (PET) or polyethylene naphthalate (PEN); polyamide; polyether such as polyether sulfone; polystyrene (PS); polyester amide; polycarbonate (PC); polyolefin; an acrylic resin such as polymethyl methacrylate (PMMA); a silicone resin; an epoxy resin; and vinyl/allyl ester (for example, PET) resin. They may be used alone or in combination of two or more of them.

The first fine particles 122 and the second fine particles 123 are not limited to particular particles and may be, for example, organic fine particles, inorganic fine particles, or a mixture thereof. Examples of the organic fine particles include a copolymer of methacrylic acid ester and styrene, a polycarbonate resin, a polymethylmethacrylate resin, a melamine resin, a polystyrene resin, and a silicone resin, and they may be used alone or in combination of two or more of them. The fine particles are particularly preferably spherical organic nanoparticles obtained by copolymerizing methacrylic acid ester and styrene or organic nanoparticles using polycarbonate as a base material. Examples of the inorganic fine particles include a metal oxide, silica, zirconia, barium sulfate, and calcium carbonate, and they may be used alone or in combination of two or more of them. Examples of the metal oxide include titanium dioxide, zinc oxide, iron oxide, and alumina, and they may be used alone or in combination of two or more of them.

The first fine particles 122 (or first fine particles 122 and second fine particles 123) cause refraction/diffraction/reflection of light at the interfaces with the transparent resin (binder resin, matrix resin) 121 utilizing the difference in refractive index from the transparent resin 121 and acts as a light-scattering material (light dispersing material, light diffusing material). The organic fine particles are characterized in, for example, having a lower specific gravity and high transparency and well dispersing in a resin and thus are preferable. The inorganic fine particles (specifically metal oxide) are prone to have lower dispersibility in a resin than the organic fine particles in formation of a scattering layer (for the reason of a large difference in specific gravity between each inorganic fine particle and resin). The organic fine particles are prone to have higher transparency than the inorganic fine particles. The inorganic fine particles can have higher refractive indexes than the organic fine particles and are thus preferable from the viewpoint of light-scattering. The larger the difference in refractive index between each of the first fine particles 122 and the second fine particles 123 and the transparent resin (binder resin) 121 is, the more easily the light is scattered or dispersed (the wavelengths are dispersed) by, for example, reflection. This is because, with the large difference in refractive index, geometric scattering or Mie scattering for the first fine particles 122 or Rayleigh scattering which contributes to scattering of target blue light in the present invention for the second fine particles 123 can increase the scattering coefficient and the scattering intensity of light. The refractive index of the transparent resin (binder resin) 121 is typically about 1.4 to about 1.5. As approximate refractive indexes n of the inorganic fine particles, titanium oxide has n=2.7, zinc oxide has n=1.9, and iron oxide has n=2.4, which are large. As described above, the inorganic fine particles can have large differences in refractive index from the transparent resin (binder resin) and can have large reflectance and thus easily cause the light to scatter or disperse (including wavelength dispersion). The organic fine particles and the inorganic fine particles may be used in combination to make full use of the advantages thereof.

The inorganic fine particles (for example, a metal oxide), for example, cause light to be reflected/diffracted at the interfaces between the inorganic fine particles and the matrix resin (binder resin, transparent resin) using the difference in refractive index and thus acts as a light-scattering agent. The organic fine particles scatter light by refraction and reflection inside the fine particles in addition to the reflection/diffraction at the interfaces. For example, the fine particles having a certain particle diameter or less is prone to cause Mie scattering or Rayleigh scattering although the mechanism of scattering light by the fine particles is not limited to particular mechanisms. The present invention can cause light to scatter using the Mie scattering or the Rayleigh scattering, for example.

The first fine particles 122 (fine particles having a larger average particle diameter) and second fine particles 123 (fine particles having a smaller average particle diameter) may be, as mentioned above, organic fine particles or inorganic fine particles. The second fine particles 123 (smaller fine particles) are however preferably organic fine particles for the following reasons.

That is, inorganic fine particles are typically produced by kneading and grinding and are thus indefinite and have large surface areas. The inorganic fine particles have large differences in refractive index from the binder resin (transparent resin 121) as mentioned above, and thus, the refractive index of light is increased, and the transmittance of the light is reduced at the interfaces between the binder resin and the fine particles. A too high content of the inorganic fine particles as the second fine particles 123 may result in a large loss of total light transmission and a degradation in optical characteristics as a light extraction member. Specifically, most of light entered into the transparent resin layer (scattering/diffusing layer) 12 is reflected in the direction from which the light enters, and the light would return to the side (organic EL layer 16 side) opposite to the side to which the light is extracted (the transparent substrate 11 side). Furthermore, a too high content of the inorganic fine particles in the transparent resin layer 12 may result in reduction in mechanical intensity itself of the transparent resin layer 12. Moreover, for example, compared with organic fine particles, inorganic fine particles are difficult to have aligned particle diameters and to be classified and has a wide particle size distribution in the above-mentioned production, and scattering (reflection) of light is thus difficult to be controlled. The inorganic fine particles having a smaller particle diameter consequently increase the burden of classification, reduce productivity, and increase production costs and the environmental burden in production.

Organic fine particles can be typically produced by polymerization which requires no grinding and classifying or which can significantly reduce the burden of grinding and classifying. The organic fine particles produced by the polymerization can easily have a spherical shape, and the particle diameter and the differences in refractive index can be easily controlled. In the organic fine particles, the particle diameter can be relatively easily controlled to be small, and the particle size distribution can be relatively easily controlled to be sharp, and the organic fine particles thus can function as a monodispersing light-scattering material. The organic fine particles thus can easily and accurately control scattering and dispersion of light. Furthermore, the structures of the organic fine particles containing, for example, dispersant can be easily controlled by controlling the material for forming the organic fine particles and the production conditions, and an additional function thus can be easily imparted. Consequently, the organic fine particles having a smaller particle diameter can be prevented from being aggregated and can have good dispersion stability. Furthermore, organic fine particles having a relatively large particle diameter allow transmission/refraction to be used as well as reflection. Thus, also for the organic fine particles having smaller differences in refractive index from the transparent resin (binder resin) than the inorganic fine particles, an effect of increasing the haze while maintaining a high visible light transmittance can be exhibited. This effect allows the transparent resin layer for use in an organic EL panel, containing the organic fine particles, to efficiently guide and diffuse light in the light emitting direction and to function as a light extraction member of the organic EL panel. This is a reason why the organic fine particles having smaller hazes than the inorganic material can have favorable optical characteristics as a light-scattering material.

A method for producing the organic fine particles is not limited to particular methods and may be, for example, the same as the commonly-used method for producing organic fine particles. Specific examples of the method include suspension polymerization, emulsion polymerization and aggregation, dissolution suspension, dispersion polymerization, and interfacial polymerization. Among them, the dissolution suspension is preferable because resins which are soluble in organic solvents, such as a polyester resin, an epoxy resin, a styrene/acrylic resin can be used regardless of their types. The dissolution suspension does not include heating in production, and a release agent having a low melting point thus can be used. Furthermore, the dissolution suspension is advantageous in that the shape can be easily controlled according to the conditions of removal of solvent. The following shows example production (steps) of organic fine particles by the dissolution suspension. That is, a resin is first dissolved in an organic solvent to prepare a resin-solvent solution. Subsequently, a fine dispersion obtained by dispersing an internal additive such as a release agent to be nanometer particles in size. The resin-solvent solution and the fine dispersion of the internal additive are then uniformly mixed to obtain an oil phase. Furthermore, a dispersant is added to water to prepare an aqueous phase. This aqueous phase is then mixed with the oil phase to suspend the oil phase as oil droplets containing a scattering agent. The solvent is then removed from the oil droplets, and an external additive is further blended (mixed) with the oil droplets. Thus, the organic fine particles (a light-scattering material or a light dispersing material) can be obtained.

In the commonly-used method for producing inorganic fine particles (kneading and grinding), it is specifically difficult to efficiently remove fine particles having diameters smaller than the median particle diameter. Thus, fine particles having a smaller median particle diameter is more prone to have a particle size distribution spreading toward a smaller particle diameter side. In contrast, the organic fine particles can be produced by the polymerization which requires no grinding and classifying or which can significantly reduce the burden of grinding and classifying, as mentioned above. The organic fine particles thus can have, for example, an approximately normal particle size distribution and are thus suitable as the second fine particles having a smaller particle diameter.

The combination of the transparent resin (binder resin) 121 and the organic fine particles (the first fine particles 122 and the second fine particles 123) is not limited to particular combinations and is, for example, as follows. For example, silicone particles, polycarbonate particles, or polystyrene particles can be used as the organic fine particles (the first fine particles 122 and the second fine particles 123) for PMMA as the transparent resin (binder resin) 121. For example, silicone particles or acrylic particles can be used as the organic fine particles (the first fine particles 122 and the second fine particles 123) for polycarbonate or polystyrene as the transparent resin (binder resin) 121.

Patent Documents 1 to 3 describe using inorganic fine particles having two types of different particle diameters. In these documents, particles having a smaller particle diameter are however used to apparently increase the refractive index of the binder resin (matrix resin) and are not used to scatter or disperse light as in the present invention. That is, for example, titanium oxide having a really high refractive index is mixed in the binder resin as particles having a smaller particle diameter to apparently increase the refractive index of the binder resin. This is intended to reduce a difference in refractive index between inorganic fine particle having a larger particle diameter and the binder resin by increasing the refractive index of the binder resin, reduce the total reflection at the interfaces, and guide light to the visible side. In Patent Documents 1 to 3, the inorganic fine particles having a larger particle diameter (sub-microns) has a function and an act of improving light extraction. These are the commonly-used techniques of extracting light without depending on the wavelength, using geometric scattering or Mie scattering. That is, the techniques of Patent Documents 1 to 3 are unintended to improve the extraction efficiency of light (for example, blue light) at a short wavelength as in the present invention.

In contrast, the present invention uses the second fine particles having an average particle diameter from 1 to 300 nm as a light-scattering material. The intensity of the scattering light caused by such particles having a sufficiently smaller particle diameter than the wavelength of light is increased inversely proportional to the fourth power of the wavelength of light. For example, the wavelength of red light is 1.5 to 2 times higher than that of blue light. The blue light thus can be scattered about 5 to 16 times more intensively than the red light. The present invention solves the above-mentioned problem with light extraction efficiency caused by the wavelength dependency (wavelength dispersion) of the refractive index of light, using this phenomenon of Rayleigh scattering.

In the present invention, the first fine particles and the second fine particles are not used to increase the refractive index of the transparent resin (binder resin). These fine particles thus may not be fine particles having really large refractive indexes as the particles having a smaller particle diameter in the Patent Documents 1 to 3. In the present invention, the first fine particles and the second fine particles however preferably have differences in refractive index from the transparent resin (binder resin) for light-scattering and light extraction efficiency. In the first fine particles and the second fine particles, the differences in refractive index from the transparent resin (binder resin) are more preferably from 0.1 to 2.0, yet more preferably from 0.2 to 1.8, particularly preferably from 0.3 to 1.7 as the ratio n1/n2, assuming that the refractive index of each fine particle is n1, and the refractive index of the resin is n2. The first fine particles and the second fine particles may each have a larger or smaller refractive index than the transparent resin (binder resin). The lower limit is preferable for light-scattering, and the upper limit is preferable for maintaining the transparency/transmittance in the above-described differences in refractive index.

Inorganic fine particles as the first fine particles and the second fine particles (specifically the second fine particles) in the present invention may be subjected to a surface treatment with, for example, aluminium hydroxide, Al stearate, polyhydroxystearic acid, Na polyacrylate, or silica, to impart the function as a light-scattering material. That is, fine particles typically have large surface areas and are prone to be charged and thus are prone to be aggregated. The fine particles are thus required to be dispersed without aggregation to function as a light-scattering material. The present invention does not require a surface treatment of the inorganic fine particles. The surface treatment however allows the surface activity of the inorganic fine particles to be suppressed, the aggregation of powders to be suppressed, the compatibility with the transparent resin (binder resin or organic matrix resin) to be enhanced, and the dispersibility in the transparent resin to be improved. The function as the light-scattering material is consequently further improved. Examples of the surface treatment include an inorganic surface treatment (coating the particle surfaces with an inorganic oxide or a hydroxide with about several nano meters to increase an affinity with a resin) and an organic surface treatment (modifying the polar groups on the particle surfaces with a silane coupling agent or a silicone to increase the affinity with a resin). The inorganic surface treatment can be, for example, the above-mentioned modification with aluminium hydroxide or silica although it is not limited to particular treatments. The organic surface treatment can be, for example, a treatment of the particle surfaces with stearic acid, a treatment of coating the particle surfaces with a silane, titanate, or aluminate coupling agent to increase the compatibility with a resin and enhance the dispersibility, although it is not limited to particular treatments. For example, the particle surfaces may further be subjected to an antistatic treatment of imparting conductivity by a sulfonation treatment to suppress the aggregation and improve dispersibility. The fine particles that are aggregated really easily and are not subjected to the surface treatment are aggregated and may result in reduction in the function as a scattering material. This aggregate has a certain size and thus causes the reduction in transmittance and the reduction in scattering ability. However, as mentioned above, the surface treatment suppresses the aggregation of fine particles that are aggregated really easily and allows the fine particles to have an improved function as a scattering material. Furthermore, the inorganic fine particles are, as mentioned above, a high-refractive-index material and thus increase the refractive index of the entire transparent resin layer for use in an organic EL panel and contribute to the increase in refractive index of light.

The refractive index of the transparent resin (binder resin) 121 is preferably as close to the refractive index of the transparent electrode 14 (for example, ITO) as possible, to cause the light from the transparent electrode 14 to enter the transparent resin 121. However, this may result in reduction in the difference in refractive index from each of the first fine particles 122 and the second fine particles 123 and ineffectiveness of light scattering. Thus, a low-refractive-index material may be selected as the transparent resin (binder resin) 121 so that the refractive index of the transparent resin 12 becomes close to that of the transparent electrode 14, and a high-refractive-index planarizing layer 13 having a refractive index which is as close to the refractive index of the transparent electrode 14 as possible may be provided thereon. The planarizing layer 13 is an optional component in the present invention, and the present invention thus may not include the planarizing layer 13. However, for the above-described reason, the present invention preferably includes the planarizing layer 13. The material of the planarizing layer 13 is not limited to particular materials and may be, for example, a resin having a high refractive index. More specifically, examples of the material include a polymethyl methacrylate (PMMA) resin, a phenol (novolac) resin, a polyimide resin, an epoxy resin, and a silicone resin. The material for forming the transparent electrode 14 is not limited to particular materials, and examples thereof include a metal oxide, an oxide semiconductor, a silver nanowire, and a carbon material. The metal oxide or the oxide semiconductor is not limited to particular metal oxides or oxide semiconductors, and examples thereof include Indium-Tin Oxide (ITO), Indium-Zinc Oxide (IZO), and zinc oxide (ZnO). The carbon material is not limited to particular materials, and examples thereof include graphene and carbon nanotube. These materials may be used alone or in combination of two or more of them.

Light more favorably enters to the substrate (e.g., glass) in the case of using a low-refractive-index material as the transparent resin (binder resin) 121 (i.e., having a small difference in refractive index from substrate 11). However, the light certainly enters into the substrate 11 even in the case of using a high-refractive-index material as the transparent resin (binder resin) 121. This is because the light entered into the substrate 11 is scattered by the first fine particles 122 and the second fine particles 123 and becomes scattering light.

The average particle diameter of the first fine particles 122 is, as mentioned above, from 300 to 50000 nm, preferably from 300 to 3000 nm, more preferably from 300 to 1500 nm, yet more preferably from 400 to 1000 nm. With increasing the particle diameter of the first fine particles 122, the influence of the first fine particles 122 becomes more significant, and asperities are more prone to be generated in dispersion of the first fine particles 122 in a transparent resin. For disposing the transparent resin layer 12 to be interposed between the substrate 11 and the transparent electrode 14 as in the present embodiment, the organic EL element is influenced by the asperities, and a short circuit and a leakage current are more prone to be generated. The asperities are preferably not too large to prevent the influence on the reliability of the organic EL panel. Specifically, the average particle diameter of the first fine particles 122 is preferably from 300 to 3000 nm. The average particle diameter of the second fine particles 123 is, as mentioned above, from 1 to 300 nm, preferably from 1 to 200 nm, more preferably from 1 to 150 nm, yet more preferably from 1 to 100 nm. The content of the second fine particles 123 is not limited to particular contents and is preferably not too low to obtain the effects of the present invention. The content of the second fine particles 123 (specifically in the case of using inorganic fine particles as the second fine particles 123) is preferably not too high not to reduce the extraction efficiency of visible light in the full wavelength region to the substrate 11 due to the reduction in content of the first fine particles 122 and the reduction in transmittance. Specifically, the content of the second fine particles 123 is preferably in the range from 1% to 30% by mass, more preferably from 10% to 30% by mass, yet more preferably from 10% to 20% by mass in the total mass of the fine particles (the sum of the masses of the first fine particles 122 and the second fine particles 123 in the present embodiment). The same applies to the following embodiments. It should be noted that the content of the second fine particles 123 is not limited thereto. For example, for the purpose of determining, changing, and adjusting the color temperature of light emitted from the organic EL layer 16, the content of the second fine particles 123 may be out of the range from 1% to 30% by mass. The same applies to the following embodiments. The proportion of the sum of the volumes of the first fine particles 122 and the second fine particles 123 is preferably from 1% to 40% as a volume ratio in the total volume of the transparent resin layer 12 (the sum of the volumes of the transparent resin 121, the first fine particles 122 and the second fine particles 123). From the viewpoint of easily preventing breakages and cracks due to a reduction in strength of the transparent resin layer 12, the volume ratio is preferably 40% or less. From the viewpoint of obtaining large intensity for light extraction efficiency to the visible side, the volume ratio is preferably 1% or more.

In the transparent resin layer and the organic EL panel of the present invention, the color temperature can be determined, changed, and adjusted (color adjustment) based on the following mechanism, for example. For example, for the organic EL panel of the present invention for use in white organic EL lighting, white can be created by additive color mixture of emitted light of a light-emitting material. In this case, the higher the content of the second fine particles (fine particles having a smaller particle diameter) in the total content of the fine particles is, the higher the color temperature is. In one example, the changes in the content of the second fine particles (fine particles having a smaller particle diameter) in the total content of the fine particles from 0% to 50% by mass, from 50% to 100% by mass causes the changes in color (color temperature) of the emitted light from, for example, from incandescent (2800 KK, Warm White (WW)) to warm white (3500K, White (W)), from warm white to white (4200 KK, Neutral (N)). Among the second fine particles, fine particles having a particle diameter from 40 to 100 nm and a large particle size distribution (high content) are preferable to efficiently extract light at a short wavelength (e.g., blue light). For example, the second fine particles (fine particles each having a smaller particle diameter) having the content of 100% by mass in the total content of the fine particles, a median particle diameter of 80 nm, and a distribution width of ±20 nm (±3σ) can change the color of the emitted light of white (4200 K, Neutral (N))) to be close to Neutral (5000 K, Daylight (D)). This mechanism, however, is a mere example, and the present invention is by no means limited thereby. For example, the relationship between the particle diameter or the content of the second fine particles and the color temperature differs depending on the characteristics and functions of the first fine particles and the second fine particles. The particle diameter and the content of the second fine particles may be adjusted considering, for example, the characteristics and the functions of the first fine particles and the second fine particles.

In the present invention, each of the "particle diameter" and the "average particle diameter" indicates a volume average particle diameter and can be determined by, for example, a particle diameter measuring device based on, for example, dynamic light-scattering (Nanotorac Wave manufactured by NIKKISO Co., Ltd.), electric resistance (Coulter Counter manufactured by BECKMAN COULTER), or laser Doppler (E-spart Analyzer manufactured by HOSOKAWA MICRON CORPORATION), which is widely known.

The thickness of the transparent resin layer 12 is not limited to particular thicknesses and can be selected, as appropriate, according to the purpose. The thickness may be in the range widely employed in films or sheets. The thickness of the transparent resin layer 12 is, for example, particularly preferably from 50 μm to 5.0 mm.

A method for producing the transparent resin layer 12 is not limited to particular methods, and the transparent resin layer 12 can be produced as follows, for example. That is, a thermoplastic resin as a material for forming a transparent resin (binder resin) 121 is first melted or dissolved in a solvent. First fine particles 122 and second fine particles 123 are then dispersed therein. The dispersion is thereafter formed into a sheet or a film. The sheet or the film of the transparent resin layer 12 is thus obtained.

A method for forming the organic EL panel 10 of FIG. 1 is also not limited to particular methods, and the organic EL panel 10 can be produced as follows, for example. A transparent resin layer 12 is first laminated on a substrate 11 formed of, for example, nonalkali glass, and a planarizing layer 13 is formed thereon. The transparent resin layer 12 may be formed on the substrate 11, for example. Alternatively, a sheet or a film of the transparent resin layer 12 may be formed in advance and then may be laminated on the substrate 11. The substrate 11 and the transparent resin layer 12 or the transparent resin layer 12 and the planarizing layer 13 may be adhered to each other with a light-transmitting adhesive or pressure-sensitive adhesive, for example, if necessary. A transparent electrode 14 of, for example, ITO is further formed on the planarizing layer 13 by, for example, sputtering. An organic EL layer 16 is further formed on the transparent electrode 14 by, for example, vacuum deposition. A cathode 15 of, for example, a metal is further formed on the organic EL layer 16. The organic EL panel 10 of FIG. 1 thus can be produced. The organic EL panel 10 of FIG. 1 may further be sealed with, for example, a glass substrate (not shown) that is different from the substrate 11.

The use of the organic EL panel 10 in FIG. 1 is also not limited to particular use, and the organic EL panel 10 can be used in the same manner as for commonly-used organic EL panels, for example.

The organic EL panel according to the present embodiment is not limited by the description. For example, the structures of, for example, the substrate 11, the transparent electrode 14, and the cathode 15 and the organic EL layer 16 and the materials and method for forming them may be any structures, materials, and methods without limitation to the description and may be the same as those for commonly-used organic EL panels.

The organic EL panel of the present invention can reduce the total reflection between the transparent electrode (e.g., ITO) 14 and the substrate (e.g., glass) and can improve the light extraction efficiency and specifically can enhance and improve the extraction of light at a short wavelength (e.g., blue wavelength region), for example. That is, the organic EL panel of the present invention can enhance the difference in amount of extracted light (pencils of light) depending on color, caused by the wavelength dispersion. The organic EL panel of the present invention thus can reduce or prevent the color unevenness in a display (e.g., a phenomenon where the edge of the organic EL panel appears to be bluish compared with the center).

The organic EL panel of the present invention can efficiently extract light at a short wavelength (e.g., a blue wavelength region) to the outside as mentioned above. This can result in, for example, the reduction in color temperature (the difference from the color temperature at the time of designing the panel) and the changes in color and color temperature when viewing the panel form an oblique angle. The organic EL panel of the present invention can improve light emission efficiency compared with commonly-used organic EL panels, thereby allowing the power consumption to be reduced.

In the organic EL panel of the present invention, extraction efficiency of light at a short wavelength (e.g., blue wavelength region) is improved, for example. This allows the drive conditions of the blue light emitting material to be relaxed. The organic EL panel of the present invention thus allow a long-life light source having a small color shift caused by lighting time to be produced, for example. For example, the color of light emitted from the organic EL layer can be corrected and changed by, for example, adjusting the content of the fine particles in the organic EL panel of the present invention.

In commonly-used organic EL panels, a structure or a scattering material is provided between the ITO and the glass substrate and between the glass substrate and the atmosphere, for example, to solve the above-mentioned problem derived from the differences in refractive index between the ITO and the glass substrate and between the glass substrate and the atmosphere. The light is thus extracted by changing an angle at which a light emitted from the organic EL layer enters. In this case, as the structure or the scattering material, a structure or a scattering material having a size of about the wavelength of the light or larger is used. This is because an assembly of molecules contained in an area having sides each of which is near the wavelength acts as a whole and apparently functions as one reflector and can efficiently extract light (geometric scattering and Mie scattering).

The intensity ratio of the scattering light to the optical path length is typically proportional to the sixth power of the diameter of the particles of, for example, a scattering material and inversely proportional to the fourth power of the wavelength of the scattering light. The amount of scattered blue light at a short wavelength thus can be larger than the mount of scattered red light by the use of a scattering material having a size of about ½ of the wavelength or less. The inventors of the present invention focused on this and completed the present invention. In the present invention, as the structure or the scattering material, a structure or a scattering material (the "second fine particles" or the "second projections") having a size smaller than the wavelength of visible light (e.g., about ½ of the wavelength of less) is contained. The light on the short wavelength side can thus be efficiently guided to the atmosphere (using Rayleigh scattering).

The haze of the organic EL panel of the present invention is not limited to particular values and is preferably from 40% to 98%, more preferably from 50% to 75%, particularly preferably from 58% to 73%, from the viewpoint of the light extraction efficiency. For example, in addition to the first fine particles (fine particles having a larger particle diameter), the second fine particles (fine particles having a smaller particle diameter) can have a particle size distribution having a coefficient of variation (CV)<10%, which is sharp in the present invention. Specifically for organic fine particles as the second fine particles, the particle size distribution is prone to be sharp such as described above. The total light transmittance of the light emitted from the organic EL layer can thus be from 70% to 85%, for example. As described above, the organic EL panel of the present invention can increase the extraction efficiency of light (for example, blue light) at a shorter wavelength than commonly-used organic EL panels while maintaining high extraction efficiency of total light (in a visible light range). It is also theoretically considered that the higher the haze of the organic EL panel of the present invention is, the higher the light extraction efficiency is. This actually cannot be always true. This tendency is significant particularly in the case of using inorganic fine particles as the light-scattering fine particles (the first fine particles and the second fine particles). The mechanism of this is, for example, assumed as follows although it is unknown. That is, the refractive index of light is increased as increasing the haze, and the diffused reflection is thus increased. The probability where light returns to the side (organic EL layer side or the rear side) opposite to the side to which the light is extracted (transparent substrate side) and the amount of such light are thus increased. Furthermore, it is also considered that, with not too high haze, the light extraction efficiency is increased in some cases by the action of good total balance of, for example, light transmittance. These mechanisms, however, are mere examples of the assumed mechanism and do not limit the present invention.

[Second Embodiment]

The following describes the second embodiment of the present invention.

Figure 2:
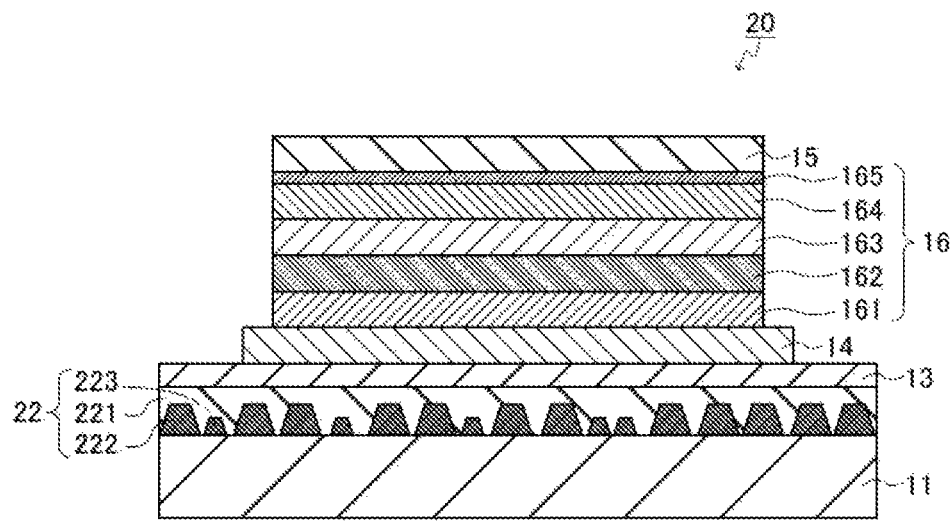
FIG. 2 is a cross-sectional view schematically illustrating a structure of the organic EL panel according to another embodiment of the present invention.

The cross-sectional view of FIG. 2 schematically shows a structure of the organic EL panel according to the present embodiment. As shown in FIG. 2, this organic EL panel 20 is the same as the organic EL panel 10 according to the first embodiment except for including a transparent resin layer 22 as a substitute for the transparent resin layer 12. The transparent resin layer 22 is configured to form an uneven structure in a transparent resin 221. More specifically, the transparent resin layer 22 is formed by forming the uneven structure on a substrate 11 and planarizing/sealing the structure with the transparent resin 221. The uneven structure includes a plurality of projections. The plurality of projections includes a first projection group including a plurality of first projections 222 and a second projection group including a plurality of second projections 223. At least either the widths or the heights of the first projections 222 are from 300 to 3000 nm. At least either the widths or the heights of the second projections 223 are from 10 to 300 nm. The uneven structure is formed so that at least either the shapes or the sizes of the projections have no periodicity. That is, the transparent resin layer 22 is the "second transparent resin layer" of the present invention.

Light entered into the uneven structure may typically cause an interference of the light. The interference is caused mainly by two periodicities of the pattern (the shape, the width, and the height) and the side angle of the projections in the uneven structure. In order to prevent the interference, the uneven structure in the present embodiment is formed so that at least either the shapes or the sizes of the projections have no periodicity as mentioned above. The interference is effectively prevented without periodicity by, for example, configuring one or both of the first projection group and the second projection group so that at least one distribution of the distribution of the distances between mountain-shaped portions (projections) or valley-shaped portions (between the projections), the distribution of the bottom areas of the projections, and the distribution of the heights of the projections includes two or more regions at least having different standard deviations.

The widths and the heights of the first projections 222 are, as mentioned above, from 300 to 3000 nm, preferably from 300 to 1500 nm, yet more preferably from 400 to 1000 nm. The widths and the heights of the second projections 223 are, as mentioned above, from 10 to 300 nm, preferably from 10 to 200 nm, more preferably from 10 to 150 nm, yet more preferably from 10 to 100 nm.

The area ratio or the abundance (abundance probability) of the second projections 223 to the first projections 222 is not limited to particular values and is preferably not too small to obtain the effects of the present invention. The area ratio of the second projections 223 is preferably not too large not to reduce the extraction of visible light in the full wavelength region to the substrate 11. Specifically, the proportion of the bottom areas of the second projections 223 in the second projection group in the sum of the bottom areas of the first projections 222 and the second projections 223 in the first and second projection groups is preferably in the range from 1% to 30%, more preferably from 3% to 25%, yet more preferably from 5% to 20%. The same applies to the following embodiments. It should be noted that the area ratio of the second projections 223, however, is not limited thereto. The area ratio of the second projections 223 may be out of the range from 1% to 30%, for example, for the purpose of determining, changing, and adjusting the color temperature of light emitted from the organic EL layer 16. The color temperature can be determined, changed, adjusted (color is adjusted), for example, on the basis of the same mechanism as in the first embodiment. The same applies to the following embodiments. The proportion of the sum of the volumes of the first projections 222 and the second projections 223 in the total volume of the transparent resin layer 22 (the sum of the volumes of the transparent resin 221, the first projections 222, and the second projections 223) is preferably from 1% to 50% as a volume ratio. Specifically, from the viewpoint of the ease of prevention of breakages and cracks due to the reduction in strength of the transparent resin layer 22, the volume ratio is preferably 50% or less. From the viewpoint of obtaining large intensity for extraction efficiency of light to the visible side and from the viewpoint of suppressing total reflection at the critical angle and guiding the light to the visible side, the volume ratio is preferably 1% or more.

The widths and the heights of the first projections and the second projections can be measured with a laser optical interferometer for profilometry, for example, a NewView series (trade name) manufactured by Zygo Corporation (Canon Inc.) or anOLS series (trade name) manufactured by Olympus Corporation; a probe-type step profiler, for example, an Alpha-Step (trade name) or a P series (trade name) manufactured by KLA Tencor Corporation; or an atomic force microscope or a scanning probe microscope, for example, an AFM5000 series (trade name) manufactured by Hitachi High-Tech Science Corporation.

The material for forming the transparent resin 221 is not limited to particular materials and is, for example, the same as for the transparent resin 121 according to the first embodiment (FIG. 1). The material for forming the uneven structure is also not limited to particular materials and may be, for example, a commonly-used thermoplastic resin or photoresist material. Light enters the substrate (for example, glass) well by using a low-refractive-index material (i.e., having a small difference in reflection from the substrate 1) as the material for forming the uneven structure. Light properly enters into the substrate 11 also by using a high-refractive-index material as the material for forming the uneven structure. This is because the light entering into the substrate 11 is scattered (refracted/diffused/reflected/elastically scattered by the electrical dipole) due to the uneven structure and becomes scattering light. From the viewpoint of scattering and dispersing light, the difference in refractive index between the material for forming the uneven structure and the material for forming the transparent resin 221 is, for example, from 0.1 to 2.0, preferably from 0.2 to 1.8, more preferably from 0.3 to 1.7 as n1/12, assuming that the refractive index of the material for forming the uneven structure is n1, and the refractive index of the transparent resin is n2.

The method for producing the organic EL panel 20 of FIG. 2 is not limited to particular methods and can be produced, for example, in the same manner as for the organic EL panel 10 according to the first embodiment (FIG. 1) except for forming the transparent resin layer 22 as a substitute for the transparent resin layer 12. The method for forming the transparent resin layer 22 is also not limited to particular methods and is, for example, as follows. That is, an uneven structure is formed of, for example, a transparent thermoplastic resin or a photoresist material on a substrate 11 formed of, for example, nonalkali glass. For the use of the thermoplastic resin, the uneven structure can be formed by, for example, press molding or nanoimprint lithography. For the use of the photoresist material, the uneven structure can be formed by, for example, photolithography. The presence of the periodicity in the shapes and the sizes of the projections (projections 222 and 223) in the uneven structure may cause an optical interference, which results in color unevenness in light-emitting surface. The projections (projections 222 and 223) are thus randomly formed to have no periodicity in at least either the shapes or the sizes of the projections.

The shapes of the first and second projections may be any shapes with which angles at which light enters can be random angles (i.e., the interference of the light can be prevented) and is not limited to particular shapes. At least either the projections or the portions (i.e., depressions) other than the projections in the asperities thus may each has a lens shape (e.g., each cross section has a semi-circular shape or an arc shape). The shapes of the projections and the depressions are by no means limited thereto, and at least either the projections or the depressions in the asperities may each has, for example, a cylindrical shape, a polygonal prism shape, a conical shape, or a polygonal pyramid shape. The asperities may be indefinite, for example, may each has a corrugated shape. The asperities particularly preferably have no critical angle that causes total reflection, i.e., at least either the projections or the depressions each has a semispherical lens shape, from the viewpoint of the extraction efficiency of light to the outside. The following fourth embodiment (FIG. 4) shows the projections each having a semispherical lens shape.

A method for forming a typical uneven structure can be, for example, a method in which a thermoplastic organic material is imprinted with a die having a certain repeating pattern or can be, for example, a method in which the uneven structure is formed by subjecting an organic film such as a resist material to photolithography using a photomask having a certain repeating pattern. In these methods, the pattern and the side angle (tilt) of the projections in the uneven structure are determined according to the die or the shape of the photomask. When the shape of the die or the photomask has a periodicity, the pattern and the side angle (tilt) of the projections in the uneven structure has a periodicity, which causes light interference. In order to prevent this, there is a method in which the pattern in the die or the photomask (e.g., the sizes and the side angles of the projections and depressions in the uneven structure) is caused to be a random pattern. For example, in order to eliminate the periodicity of the side angles of the projections, there is a method in which the heights of the projections are caused to be different from one another or a method in which side angles are changed by changing the sizes of the projections. Alternatively, there is, for example, a method in which the angles of the side surfaces of projections are caused to be random angles by forming each smaller projection on each surface (e.g., side surface) of each larger projection. However, the shape of the die or the photomask is in microsize or nanosize. The enormous volumes of data are thus required to produce the random shape (having no periodicity). A more simple method is, for example, as follows.

That is, the first projections (at least either the widths or the heights are from 300 to 3000 nm) can be polygonal or cylindrical projections each having a bottom side or a diameter of about 5 μm which is the exposure limit resolution size. Alternatively, finer shape can be produced by nanoimprint, and the first projections thus can be polygonal or cylindrical projections having a bottom side or a diameter which is the same as the height or less. For the formation of the first projections by photolithography, the widths, the height, and the shapes of the first projections can be changed by, for example, multiple exposure, shifting exposure, a re-exposure development after the first exposure and development and before postbake, and multiple heat treatments under different temperature conditions after the first exposure and development. The first projections having no periodicity in at least either the shapes or the sizes can be formed accordingly. For the formation of the first projections by nanoimprint, the widths, the heights, and the shapes of the first projections can be changed by, for example, preparing a plurality of dies in which each width, height, and shape of one surface of projections in the asperities are different and imprinting a plurality of times. The first projections having no periodicity in at least either the shapes or the sizes can be formed accordingly.

A method for forming the second projections can be, for example, fine-processing of the first projections by a surface treatment. The surface treatment is not limited to particular treatments, and examples thereof include dry processes such as a plasma treatment and a treatment using excimer UV. Specifically, the surface asperities of the second projections are formed by, for example, dry etching or ashing in the dry process. The surfaces of the first projections and the second projections can be curved by a subsequent heat treatment after the dry process, for example. The plasma treatment is not limited to particular treatments and can be, for example, a plasma treatment using an oxygen gas under atmospheric pressure or vacuum. The plasma treatment can be, for example, a reactive ion etching treatment using inactive gas such as argon. The treatment using excimer UV uses excimer light in the vacuum ultraviolet range and is simpler than the plasma treatment.

The second projections can be formed by photolithography. In this case, for example, the exposure state is caused to be underexposure at the time of using a negaresist, and small second projections thus can be formed. Examples of a method for causing the exposure state to be underexposure include: adjusting the distance between a photomask and a substrate (exposure gap) and the exposure amount; reducing the thickness of resist coating; and reducing the exposure time. The reverse operation is performed at the time of using a positive resist, and small second projections thus can be formed. Alternatively, small second projections can be formed by using anisotropic development.

The second projections can be formed also by nanoimprint. That is, for example, asperities in the order of 10 nm can be formed by nanoimprint. For example, a heat treatment and an imprint treatment can be again performed using a die having the sizes of the second projections after forming the first projections.

Figure 8A:
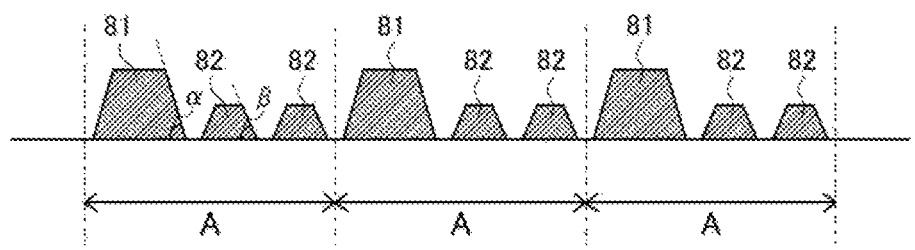
FIG. 8A is a cross-sectional view schematically illustrating an example where the shapes and the sizes of projections have a periodicity.
Figure 8B:
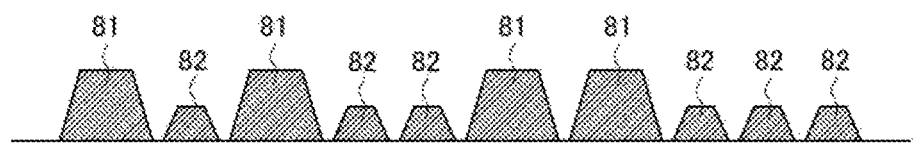
FIG. 8B is a cross-sectional view schematically illustrating an example where the shapes and the sizes of projections have no periodicity.

The above-described method can eliminate the periodicity of the pattern and the periodicity of the side angles of the projections in the uneven structure, for example. That is, the uneven structure having no periodicity in at least either the shapes or the sizes of the projections can be formed. Accordingly, the effects of reducing and scattering the reflection can be obtained from the projections having different sizes while preventing the unevenness in color due to the light interference, and the extraction of light in a short wavelength region (e.g., blue light) can be enhanced and improved. The cross-sectional views of FIGS. 8A and 8B schematically illustrate an example where the shapes and the sizes of projections have a periodicity and an example where the shapes and the sizes of projections have no periodicity, respectively. FIG. 8A shows an example where the shapes and the sizes of projections have a periodicity. As shown in this example of FIG. 8A, an asperity including a larger projection (first projection) 81 and two smaller projections (second projections) 82 in a constant width A is repeatedly aligned so that the repeated asperities have the same shape and size. The projections 81 in FIG. 8A have the same shape and size and each has a side angle (angle formed between the side surface and the bottom surface) of α. The projections 81 in FIG. 8A have the same shape and size and each has a side angle (angle formed between the side surface and the bottom surface) of β. That is, in the example of FIG. 8A, both of the shapes and the sizes have a periodicity. In the example of FIG. 8B, larger projections (first projections) 81 and smaller projections (second projections) 82 are randomly (irregularly) aligned, and none of the shapes and the sizes of the projections has periodicity. The transparent resin layer 22 in FIG. 2 also shows an example of having no periodicity in shapes and sizes of projections, as mentioned above. In the transparent resin layer 22 in FIG. 2, the side angle (angle formed between the side surface and the bottom surface) of each first projection 222 and the side angle of each second projection 223 are illustrated to be nearly identical to each other and however may be different from each other. FIG. 2 illustrates the first projections 222 having the same shape and size, and the first projections 222 may however have different sizes and shapes (e.g., side angles), for example. Similarly, FIG. 2 illustrates the second projections 223 having the same shape and size, and the first projections 223 may however have different sizes and shapes (e.g., side angles), for example.

The uneven structure is consequently planarized by the transparent resin 221. Thus, the transparent resin layer 22 is formed. Alternatively, the transparent resin layer 22 formed into a film or a sheet is produced in advance and is then laminated on the substrate 11. The substrate 11 and the transparent resin layer 22 may be adhered to each other with a light-transmitting adhesive or light-transmitting pressure-sensitive adhesive, if necessary.

The use of the organic EL panel 20 according to the present embodiment is also not limited to particular use, and the organic EL panel 20 can be used in the same manner as for commonly-used organic EL panels and the organic EL panel 10 according to the first embodiment (FIG. 1), for example. The effects of the organic EL panel 20 according to the present embodiment are, for example, also the same as those of the organic EL panel 10 according to the first embodiment (FIG. 1).

[Third Embodiment]

The following describes the third embodiment of the present invention.

Figure 3:
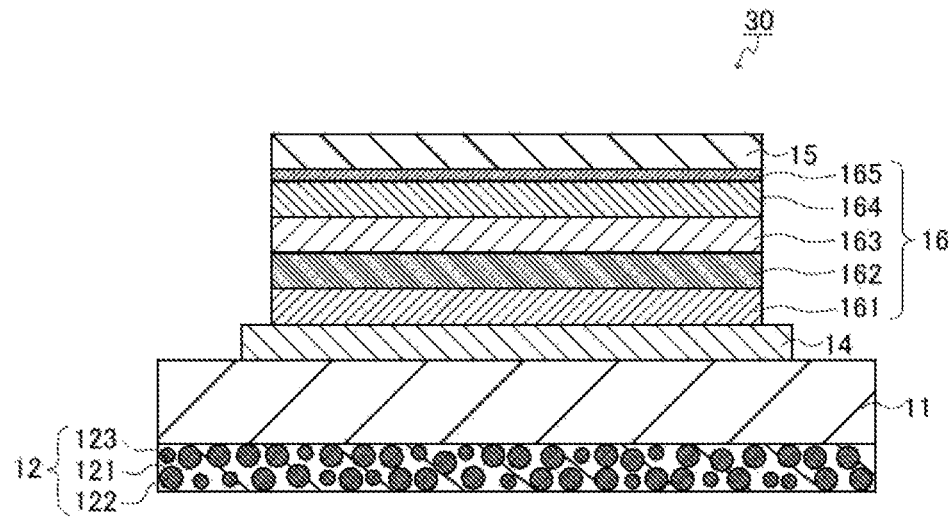
FIG. 3 is a cross-sectional view schematically illustrating a structure of the organic EL panel according to still another embodiment of the present invention.

The cross-sectional view of FIG. 3 schematically illustrates a structure of the organic EL panel according to the present embodiment. As shown in FIG. 3, this organic EL panel 30 includes no transparent resin layer 12 and a planarizing layer 13 between a substrate 11 and a transparent electrode 14. The transparent resin layer 12 is laminated on one surface of the substrate 11 to interpose the substrate between the transparent electrode 14 and the transparent resin layer 12. Except for this, the organic EL panel 30 of FIG. 3 is the same as the organic EL panel 10 according to the first embodiment.

A method for producing the organic EL panel 30 of FIG. 3 is not limited to particular methods, and the organic EL panel 30 can be produced, for example, in the same manner as for the organic EL panel 10 according to the first embodiment (FIG. 1) except that the transparent resin layer 12 is laminated on one surface of the substrate 11 to interpose the substrate 11 between the transparent electrode 14 and the transparent resin layer 12. In this case, the transparent electrode 14, the organic EL layer 16, and the cathode 15 may be laminated on the other surface of the substrate 11 before laminating the transparent resin layer 12 on the one surface of the substrate 11. Alternatively, the transparent resin layer 12 may be laminated on the one surface of the substrate 11 before laminating the transparent electrode 14, the organic EL layer 16, and the cathode 15 on the other surface of the substrate 11.

The use of the organic EL panel 30 according to the present embodiment is also not limited to particular use, and the organic EL panel 30 can be used in the same manner as for the organic EL panels according to the first and second embodiments or commonly-used organic EL panels, for example. The effects of the organic EL panel 30 according to the present embodiment are also, for example, the same as those of the organic EL panels according to the first and second embodiments.

[Fourth Embodiment]

The following describes the fourth embodiment of the present invention.

Figure 4:
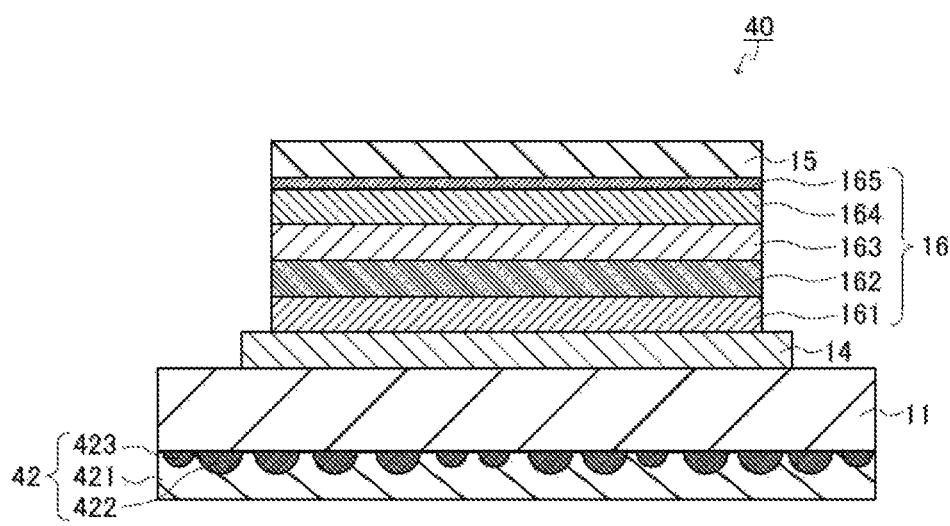
FIG. 4 is a cross-sectional view schematically illustrating a structure of the organic EL panel according to still another embodiment of the present invention.

The cross-sectional view of FIG. 4 schematically illustrates a structure of the organic EL panel according to the present embodiment. As shown in FIG. 4, this organic EL panel 40 is the same as the organic EL panel 30 of the third embodiment except for including a transparent resin layer 42 as a substitute for the transparent resin layer 12.

The transparent resin layer 42 is configured by forming an uneven structure in a transparent resin 421. More specifically, the transparent resin layer 42 is formed by forming the uneven structure on a substrate 11 and sealing the uneven structure with the transparent resin 421. The uneven structure includes first projections 422 in which at least either the widths or the heights are in the range from 300 to 1000 nm and second projections 423 in which at least either the widths or the heights are in the range from 10 to 100 nm. The uneven structure is formed so that at least either the shapes or the sizes of the projections have no periodicity. As shown in FIG. 4, the first projections 422 and the second projections 423 in this transparent resin layer 42 each has a hemispherical convex lens (microlens) shape. The transparent resin layer 42 is the same as the transparent resin layer 22 of the second embodiment (FIG. 2) except that the uneven structure (the shapes of the first projections 422 and the second projections 423) is different. That is, the transparent resin layer 42 is "the second transparent resin layer" of the present invention.

A method for producing the organic EL panel 40 of FIG. 4 is not limited to particular methods. The organic EL panel 40 may be produced, for example, in the same manner as for the organic EL panel 30 according to the third embodiment (FIG. 3) except that the transparent resin layer 42 is formed on one surface of the substrate 11 to interpose the substrate 11 between the transparent electrode 14 and the transparent resin layer 42 as a substitute for the transparent resin layer 12. The transparent resin layer 42 can be formed in the same manner as for the transparent resin layer 22 according to the second embodiment (FIG. 2) except that the uneven structure (the shapes of the first projections 422 and the second projections 423) is different.

The use of the organic EL panel 40 of FIG. 4 is also not limited to particular use, and the organic EL panel 40 can be used in the same manner as for the organic EL panels according to the first to third embodiments or commonly-used organic EL panels. The effects of the organic EL panel 40 of FIG. 4 are also the same as those of the organic EL panels according to the first to third embodiments.

[Fifth Embodiment]

The following describes the fifth embodiment of the present invention.

Figure 5:
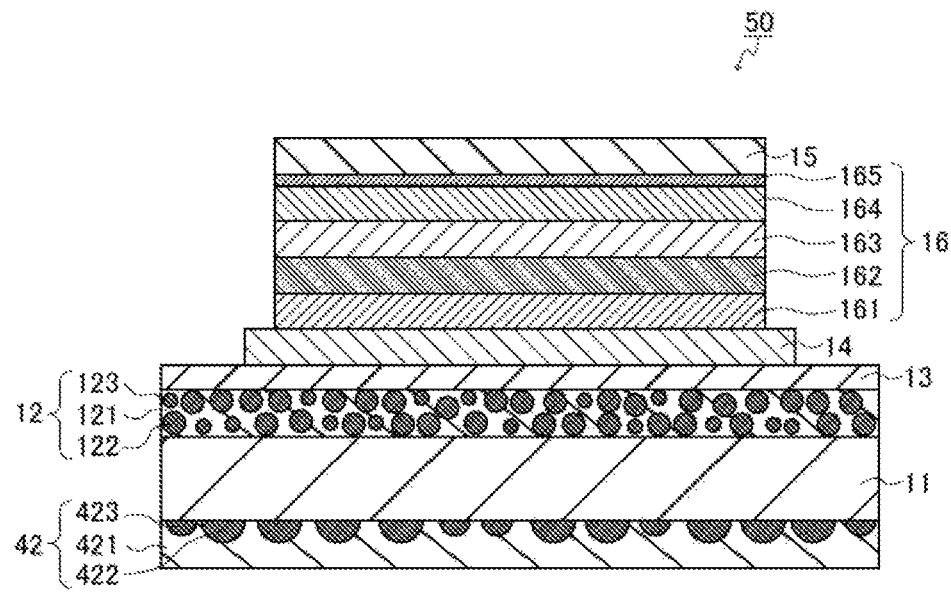
FIG. 5 is a cross-sectional view schematically illustrating a structure of the organic EL panel according to still another embodiment of the present invention.

The cross-sectional view of FIG. 5 schematically illustrates a structure of the organic EL panel according to the present embodiment. In this organic EL panel 50, a transparent resin layer 42 is disposed on one surface of the substrate 11 to interpose the substrate 11 between the transparent electrode 14 and the transparent resin layer 42. Except for this, the organic EL panel 50 is the same as the organic EL panel 10 according to the first embodiment (FIG. 1). That is, the organic EL panel 50 of FIG. 5 includes a substrate 11 and two transparent resin layers including a transparent resin layer 12 on one surface of the substrate 11 and a transparent resin layer 42 on the other surface of the substrate 11. As described above, the respective transparent resin layers of the present invention on both sides of the substrate can cause a more efficient extraction of more light at a short wavelength (i.e., blue light) to the outside of the organic EL panel (the atmosphere) than the single transparent resin layer of the present invention.

The structure of the organic EL panel according to the present embodiment is not limited to the structure of the organic EL panel 50 in FIG. 5. For example, in the organic EL panel 50 of FIG. 5, "the first transparent resin layer" of the present invention is disposed on one surface of the substrate 11, which is the same as the side on which the transparent electrode 14 is disposed, and "the second transparent resin layer" of the present invention is disposed on the other surface. Conversely, "the second transparent resin layer" of the present invention may be disposed on one surface of the substrate 11, which is the same as the side on which the transparent electrode 14 is disposed, and "the first transparent resin layer" of the present invention may be disposed on the other surface.

"The respective first transparent resin layers of the present invention or " the respective second transparent resin layers" of the present invention may be disposed on one surface of the substrate 11, which is the same as the side on which the transparent electrode 14 is disposed and the other surface. However, it is preferred that "the first transparent resin layer" of the present invention is disposed on one surface of the substrate 11, and "the second transparent resin layer" of the present invention is disposed on the other surface, as mentioned above. This is because the use of the transparent resin layers having different structures in combination can cause more efficient scattering (dispersion, diffusion) of light and an extraction of more light at a short wavelength (e.g., blue light) to the outside of the organic EL panel (the atmosphere) as described above. For example, light once passed through light-scattering fine particles and scattered (dispersed, diffused) and then passed through an uneven structure which is different in shape from the light-scattering fine particles is more effectively guided to the outside of the organic EL panel than light once passed through light-scattering fine particles and scattered (dispersed, diffused) and then again passed through light-scattering fine particles. The same applies to the light first passed through the uneven structure and then passed through the light-scattering fine particles. "The first transparent resin layer" and "the second transparent resin layer" of the present invention are thus preferably used in combination as mentioned above.

A method for producing the organic EL panel according to the present embodiment is also not limited to particular methods and can be, for example, a method based on the methods for producing the organic EL panels according to the first to fourth embodiments. The use of the organic EL panel according to the present embodiment is also not limited to particular use, and the organic EL panel can be used in the same manner as for the organic EL panels according to the first to fourth embodiments or commonly-used organic EL panels, for example.

[Sixth Embodiment]

The following describes the sixth embodiment of the present invention.

The present embodiment describes a top-emission-type organic EL panel which extracts light from a sealing substrate side facing a substrate.

Figure 10:
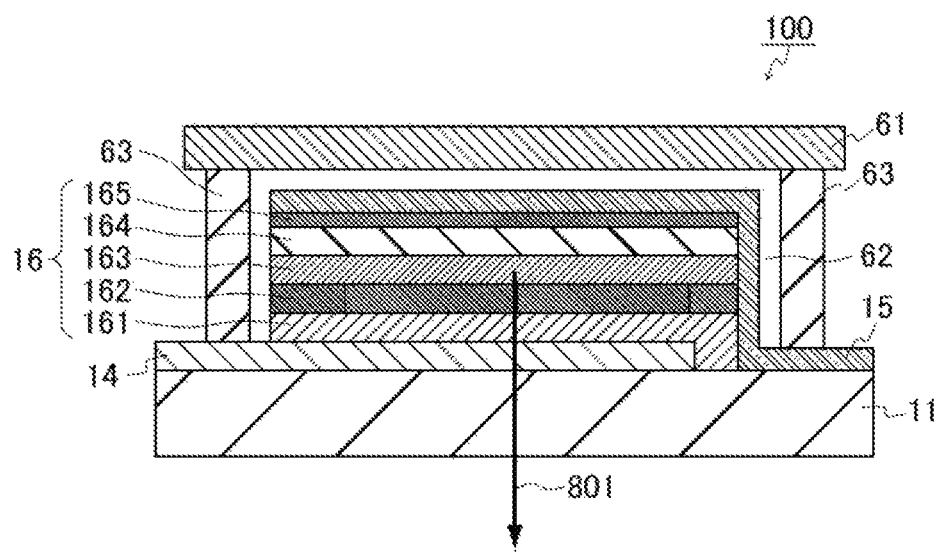
FIG. 10 is a cross-sectional view schematically illustrating another example structure of a commonly-used organic EL panel.
Figure 11:
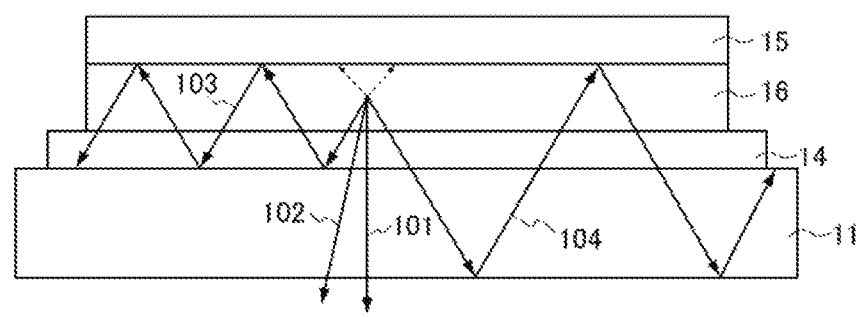
FIG. 11 is a cross-sectional view schematically illustrating an example waveguide of light in a commonly-used organic EL panel.
Figure 12:
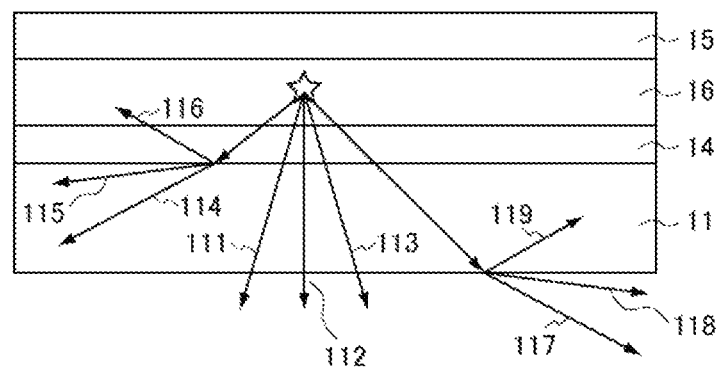
FIG. 12 is a cross-sectional view schematically illustrating another example waveguide of light in a commonly-used organic EL panel.

The cross-sectional view of FIG. 10 schematically illustrates another example structure of a commonly-used organic EL panel. As shown in FIG. 10, this organic EL panel 100 is the same as the organic EL panel 90 of FIG. 9 except for the following items. One end of a cathode 15 is extended and is in contact with one surface of a substrate 11 to be in contact with each one side surface of a hole injection layer 161, a hole transport layer 162, a light-emitting layer 163, an electron transport layer 164, and an electron injection layer 165 and not to be in contact with and to be separated from the cathode 14. The sides of the hole injection layer 161, the hole transport layer 162, the light-emitting layer 163, the electron transport layer 164, and the electron injection layer 165 are covered with sealing parts 63. The end of the cathode 15 (the end on the right side of FIG. 10) and one end of the anode 14 (the end on the left side of FIG. 10) on the other side of the end of the cathode 15 are extended to the right side and the left side, respectively in the state of being interposed between each sealing part 63 and the transparent substrate 11, and the extended portions of the cathode 15 and the anode 14 can be connected to, for example, an outside power supply source (not shown). A transparent sealing substrate 61 is adhered to the upper surfaces (the opposite sides of the transparent substrate 11) of the sealing parts 63 to cover the hole injection layer 161, the hole transport layer 162, the light-emitting layer 163, the electron transport layer 164, and the electron injection layer 165 and face the transparent substrate 11. The hole injection layer 161, the hole transport layer 162, the light-emitting layer 163, the electron transport layer 164, and the electron injection layer 165 are thus covered and sealed with the transparent substrate 11, the transparent sealing substrate 61, and the sealing parts 63. The numeral 62 in FIG. 10 indicates a filler, and the same applies to FIGS. 6 and 7. The transparent sealing substrate 61 is formed of, for example, glass. In the organic EL panel 100 of FIG. 10, light is extracted from the transparent substrate 11 side as shown in an arrow 801 of FIG. 10.

Figure 6:
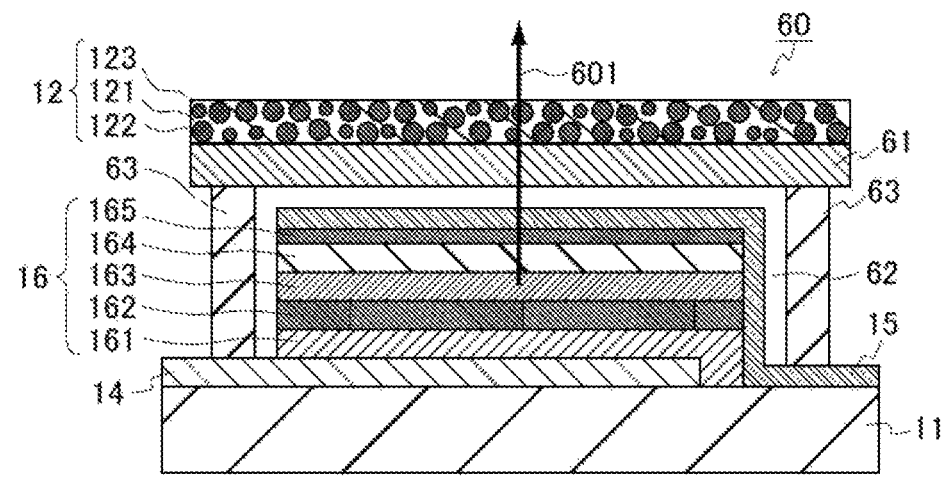
FIG. 6 is a cross-sectional view schematically illustrating a structure of the organic EL panel according to still another embodiment of the present invention.

The cross-sectional view of FIG. 6 schematically illustrates a structure of the organic EL panel according to the present embodiment. As shown in FIG. 6, this organic EL panel 60 includes: a transparent substrate 11; and an anode 14; an organic EL layer 16, and a transparent electrode (cathode) 15 laminated on one surface of the transparent substrate 11 in this order. One end of the transparent electrode (cathode) 15 is extended and is in contact with one surface of a substrate 11 to be in contact with each one side surface of a hole injection layer 161, a hole transport layer 162, a light-emitting layer 163, an electron transport layer 164, and an electron injection layer 165 and not to be in contact with and to be separated from the cathode 14. The sides of the hole injection layer 161, the hole transport layer 162, the light-emitting layer 163, the electron transport layer 164, and the electron injection layer 165 are covered with sealing parts 63. The end of the transparent electrode (cathode) 15 (the end on the right side of FIG. 10) and one end of the anode 14 (the end on the left side of FIG. 10) on the other side of the end of the transparent electrode (cathode) 15 are extended to the right side and the left side, respectively in the state of being interposed between each sealing part 63 and the transparent substrate 11, and the extended portions of the transparent electrode (cathode) 15 and the anode 14 can be connected to, for example, an outside power supply source (not shown). A transparent sealing substrate 61 is adhered to the upper surfaces (the opposite sides of the transparent substrate 11) of the sealing parts 63 to cover the hole injection layer 161, the hole transport layer 162, the light-emitting layer 163, the electron transport layer 164, and the electron injection layer 165 and face the transparent substrate 11. The hole injection layer 161, the hole transport layer 162, the light-emitting layer 163, the electron transport layer 164, and the electron injection layer 165 are thus covered and sealed with the transparent substrate 11, the transparent sealing substrate 61, and the sealing parts 63. A transparent resin layer 12 is provided on the transparent sealing substrate 61. The transparent substrate 11 is the same as the transparent substrate 11 in the first to fifth embodiments. The anode 14 is formed of, for example, ITO or a metal. The transparent electrode (cathode) 15 is formed of, for example, a thin metal film or ITO. The transparent sealing substrate 61 is formed of, for example, glass or a transparent film. Any of fillers and sealing parts used in commonly-used organic EL panels can be used as the filler 62 and the sealing parts 63. The transparent resin layer 12 is the same as the transparent resin layer 12 in the first embodiment. With such configuration, light is extracted from the transparent sealing substrate 61 side as shown in an arrow 601 of FIG. 6 in the organic EL panel 60 according to the present embodiment.

FIG. 6 shows "the first transparent layer" 12 of the present invention. "The second transparent resin layer" 22 or 42 of the present invention described in the second or fourth embodiment can also be used as the transparent resin layer in the organic EL panel according to the present embodiment.

A method for producing the organic EL panel according to the present embodiment is also not limited to particular methods and can be, for example, a method based on the methods for producing the organic EL panels according to the first to fifth embodiments and commonly-used top-emission-type organic EL panels. The use of the organic EL panel according to the present embodiment is also not limited to particular use, and the organic EL panel can be used in the same manner as for commonly-used top-emission-type organic EL panels such as displays and lightings, for example.

In the organic EL panel according to the present embodiment, "the first transparent resin layer" or "the second transparent resin layer" of the present invention is disposed on a transparent sealing substrate. The organic EL panel thus brings about the same effects as for the first to fifth embodiments of, for example, solving the problem with light extraction efficiency caused by the wavelength dependency (wavelength dispersion) of the refractive index of light in extraction of light from the transparent sealing substrate side.

[Seventh Embodiment]

The following describes the seventh embodiment of the present invention.

The present embodiment describes a double-sided light emission/double-sided light extraction (see-through) organic EL panel, which extracts light from both of the substrate side and the sealing substrate side facing the substrate.

Figure 7:
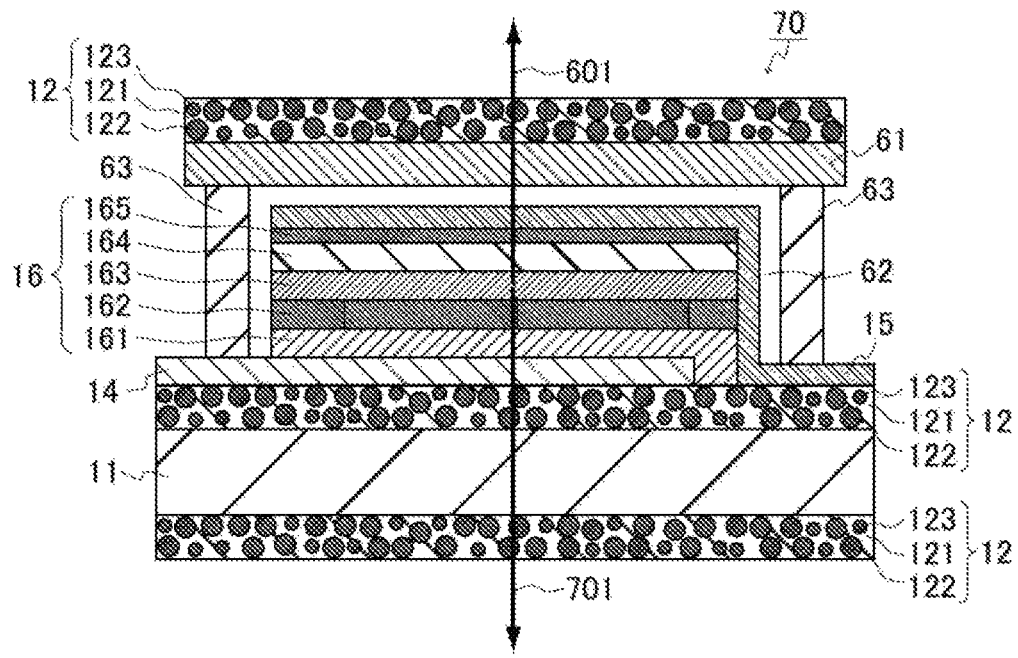
FIG. 7 is a cross-sectional view schematically illustrating a structure of the organic EL panel according to still another embodiment of the present invention.

The cross-sectional view of FIG. 7 schematically illustrates a structure of the organic EL panel according to the present embodiment. As shown in FIG. 7, this organic EL panel 70 is the same as the organic EL panel 60 according to the sixth embodiment except for the following items. Transparent resin layers 12 are disposed on one surface of a transparent substrate 11 to be interposed between the substrate 11 and an anode 14 and the other surface of the substrate 11. With such configuration, light is extracted from both of the transparent substrate 11 side and the transparent sealing substrate 61 side as shown in arrows 601 and 701 of FIG. 7 in the organic EL panel 70 according to the present embodiment.

In the organic EL panel of FIG. 7, the transparent resin layers 12 are disposed on both of one surface of a transparent substrate 11 to be interposed between the substrate 11 and an anode 14 and the other surface of the substrate 11. However, a transparent resin layer 12 may be disposed on either the one surface or the other surface.

FIG. 7 shows "the first transparent resin layer" 12 of the present invention described in the first embodiment as each of three transparent resin layers. However, in the organic EL panel, "the second transparent resin layer" 22 or 42 of the present invention may be used as some or all of the transparent resin layers.

A method for producing the organic EL panel according to the present embodiment is not limited to particular methods and can be, for example, a method based on the methods for producing the organic EL panel according to the first to sixth embodiments and commonly-used double-sided light emission/double-sided light extraction (see-through) organic EL panels. The use of the organic EL panel according to the present embodiment is also not limited to particular use, and the organic EL panel can be used in the same manner as for commonly-used double-sided light emission/double-sided light extraction (see-through) organic EL panels such as lightings, for example.

In the organic EL panel according to the present embodiment, "the first transparent resin layer" or "the second transparent resin layer" of the present invention is disposed on each of the transparent substrate side and the transparent sealing substrate side. The organic EL panel thus brings about the same effects as for the first to sixth embodiments of, for example, solving the problem with light extraction efficiency caused by the wavelength dependency (wavelength dispersion) of the refractive index of light in extraction of light from both of the transparent substrate side and the transparent sealing substrate side.

EXAMPLE

As an example, an organic EL panel having the same structure as in FIG. 1 was produced. As a comparative example, an organic EL panel having the same structure as in FIG. 9 was produced. The light emissions of these organic EL panels were observed. The results showed as follows. In the organic EL panel of the example, there was no color unevenness in a display, and the color of the reflected light at the edge of the panel was the same as that of the light emitting surface (the center of the panel). In contrast, in the organic EL panel of the comparative example, the portions corresponding to the respective electrodes at the edge of the panel were bluish compared with the light emitting surface (the center of the panel). This is because guided blue light is reflected at pads of the cathode (metal electrode) extraction portion and the anode extraction portion.

The production and characteristic evaluations of the organic EL panels of the example and the comparative example were performed specifically as follows.

[1. Production of Organic EL Panel of the Example]

A light-scattering layer (including: a transparent resin layer 12 for use in an organic EL panel; and a planarizing layer 13) was formed on a glass substrate 11. That is, 100 parts by mass of an acrylic resin solution mainly containing polymethyl methacrylate as a transparent resin was prepared. First fine particles 122 and second fine particles 123 were then mixed, kneaded, and dispersed in the solution. Thus, a light-scattering material was prepared. As the first fine particles 122, 20 parts by mass of silicone fine particles having an average particle diameter from 0.5 to 1.2 μm was used. As the second fine particles 123, 3 parts by mass of silicone fine particles having an average particle diameter of 200 nm and 0.5 parts by mass of silicone fine particles having an average particle diameter of 40 nm were used. The light-scattering material was subsequently applied, dried, and cured on a nonalkali glass substrate 11 with a slit coater to have a predetermined thickness. Thus, a transparent resin layer 12 including: a transparent resin 121; and first fine particles 122 and second fine particles 123 dispersed in the transparent resin 121 was formed. A solution having the same composition as the acrylic resin solution was further applied, dried, and cured on the transparent resin layer 12 to form the planarizing film 13. The light-scattering layer (including the transparent resin layer 12 and the planarizing layer 13) was formed as described above. The light-scattering layer after curing had a thickness of 3.0 μm, a haze of 67%, a total light transmittance measured by spectrophotometer of 82%.

A film of ITO as an anode of the organic EL panel was thereafter formed on the light-scattering layer by sputtering to form a transparent electrode (anode) 14. An organic EL layer 16 was further formed on the transparent electrode (anode) 14 by vacuum deposition. A cathode 15 of aluminium was further formed on the organic EL layer 16 by vacuum deposition. The organic EL lighting panel shown in FIG. 1 was produced as described above. The organic EL layer 16 was a laminate including a hole injection layer 161, a hole transport layer 162, a light-emitting layer 163, a hole block layer (not shown), an electron transport layer 164, an electron injection layer 165 laminated from the transparent electrode 14 (ITO film) side in this order. The materials for forming the respective layers are as follows.

Hole injection layer: Cu-Pc (copper phthalocyanine)
Hole transport layer: α-NPD
(N,N'-diphenyl-N—N-bis(1-naphthyl)-1,1'-biphenyl)-4,4'-diamine)
Light-emitting layer: host; CBP (4,4'-biscarbazolyl biphenyl)
  dopant; Ir(ppy)3(tris-(2-ferylpyridine)iridium complex), Btp2Ir (acac) (bis(2-(2'-benzo(4,5-α)thienyl)pyridinate-N,C2')(acetylacetonate)iridium complex), FIr (pic) ((bis(4,6-di-fluorophenyl)-pyridinate-N,C2') picolinate iridium complex)
Hole block layer: BCP (2,9-dimethyl-4,7-diphenyl-1,10-phenanthroline)
Electron transport layer: Alq3
Electron injection layer: LiF

[2. Characteristic Evaluation (Chromaticity Uniformity Evaluation) of Organic EL Panel of the Example]

A constant current of 25 A/m² as a drive current was applied to the organic EL panel of the example to light the organic EL panel. The drive voltage was 4.5 V, and the brightness was 1680 cd/m². The chromaticity uniformity of this organic EL panel was evaluated as follows. That is, the total of five chromaticities at the center and the neighboring portions in this organic EL panel were measured, each u' and each v' were then calculated, and the difference Δu'v' in chromaticity between the center and each neighboring portion was calculated. The average difference in chromaticity in this organic EL panel was 0.003, and the maximum difference was 0.004 which was 0.01 (10/1000) or less. This demonstrated high chromaticity uniformity. The difference Δu'v' in chromaticity was represented by the following mathematical formula (1).

$$\Delta u'v' = \{(u1'-u2')^2 + (v1'-v2')^2\}^{1/2} \quad (1)$$

[3. Production of Organic EL Panel of the Comparative Example]

The organic EL panel of the comparative example was produced in the same manner as in the example except that the light-scattering layer (the transparent resin layer 12 and the polarizing layer 13) was not formed.

[4. Characteristic Evaluation (Chromaticity Uniformity Evaluation) of Organic EL Panel of the Comparative Example]

A constant current of 25 A/m² as a drive current was applied to the organic EL panel of the comparative example to light the organic EL panel. The drive voltage was 4.7 V, and the brightness was 850 cd/m². The average difference in chromaticity between the center and the neighboring portions of this organic EL panel was 0.031 (31/1000), the uniformity of the chromaticity was unfavorable, and the neighboring portions were bluish.

The present invention is described above with reference to the exemplary embodiments and the example. The present invention however is by no means limited thereto. Various changes and modifications that may become apparent to those skilled in the art may be made in the configuration and specifics of the present invention without departing from the scope of the present invention.

The transparent resin layer of the present invention is usable in an organic EL lighting panel or an organic display panel, for example. That is, the organic EL panel of the present invention can be, for example, an organic EL lighting panel or an organic EL display panel. The organic EL panel of the present invention is usable in, for example, backlight of liquid crystal display. The organic EL panel of the present invention can also be used for, for example, an interior, an exterior, or mounting in vehicles. The present invention however is by no means limited thereto, and the organic EL panel of the present invention is applicable to a wide range of use and is usable for anything as for the commonly-used organic EL panels, organic EL lighting devices, and organic EL displays. The organic EL panel (light source) of the present invention is not limited to be used in an organic EL lighting device and an organic EL display and is widely applicable to any device which requires a light source.

Part or the whole of the exemplary embodiments disclosed above can be described as in the following supplementary notes. It should be noted, however, that the present invention is by no means limited thereto.

(Supplementary Note 1)

A transparent resin layer for use in an organic EL panel including:
  a transparent resin; and
  a plurality of light-scattering fine particles dispersed in the transparent resin, wherein the plurality of light-scattering fine particles includes:
a first fine particle group including light-scattering fine particles having an average particle diameter from 300 to 50000 nm, and
a second fine particle group including light-scattering fine particles having an average particle diameter from 1 to 300 nm.

(Supplementary Note 2)

The transparent resin layer according to Supplementary Note 1, wherein the content of the light-scattering particles of the second fine particle group is in the range from 1% to 30% by mass in the total mass of the light-scattering fine particles.

(Supplementary Note 3)

The transparent resin layer according to Supplementary Note 1 or 2, wherein the light-scattering particles of the first fine particle group have an average particle diameter in the range from 300 to 3000 nm.

(Supplementary Note 4)

A transparent resin layer for use in an organic EL panel, including:
a transparent resin, and
a plurality of light-scattering fine particles dispersed in the transparent resin, wherein
the plurality of light-scattering fine particles has an average particle diameter from 300 to 50000 nm.

(Supplementary Note 5)

A transparent resin layer for use in an organic EL panel, including:
a transparent resin; and
a plurality of light-scattering fine particles dispersed in the transparent resin, wherein
the plurality of light-scattering fine particles has an average particle diameter from 1 to 300 nm.

(Supplementary Note 6)

The transparent resin layer according to any one of Supplementary Notes 1 to 5, wherein the light-scattering fine particles are at least either organic fine particles or inorganic fine particles.

(Supplementary Note 7)

The transparent resin layer according to Supplementary Note 6, wherein the light-scattering particles of the first fine particle group are at least either organic fine particles or inorganic fine particles.

(Supplementary Note 8)

The transparent resin layer according to Supplementary Note 6 or 7, wherein the light-scattering particles of the second fine particle group is at least either organic fine particles or inorganic fine particles.

(Supplementary Note 9)

The transparent resin layer according to any one of Supplementary Notes 6 to 8, wherein the organic fine particles are at least one selected from the group consisting of a copolymer of methacrylic acid ester and styrene, a polycarbonate resin, a polymethylmethacrylate resin, a melamine resin, a polystyrene resin, and a silicone resin.

(Supplementary Note 10)

The transparent resin layer according to any one of Supplementary Notes 6 to 9, wherein the inorganic fine particles are at least one selected from the group consisting of a metal oxide, silica, zirconia, a barium sulfate, and a calcium carbonate.

(Supplementary Note 11)

The transparent resin layer according to Supplementary Note 10, wherein the metal oxide is at least one selected from the group consisting of a titanium dioxide, a zinc oxide, an iron oxide, and alumina.

(Supplementary Note 12)

The transparent resin layer according to any one of Supplementary Notes 1 to 11, wherein the light-scattering particles of the second fine particle group are organic fine particles.

(Supplementary Note 13)

A transparent resin layer for use in an organic EL panel, including:
a transparent resin; and
an uneven structure formed in the transparent resin, the uneven structure including a plurality of projections, wherein
the plurality of projections includes:
a first projection group including projections, at least either the widths or the heights of the projections of the first projection group being in the range from 300 to 3000; and
a second projection group including projections, at least either the widths or the heights of the projections of the second projection group being in the range from 10 to 300 nm, and
at least either the shapes or the sizes of the plurality of projections in the uneven structure have no periodicity.

(Supplementary Note 14)

The organic EL panel according to Supplementary Note 13, wherein the proportion of the bottom areas of the projections of the second projection group is in the range from 1% to 30% in the sum of the bottom areas of the projections of the first and second projection groups.

(Supplementary Note 15)

The transparent resin layer according to Supplementary Note 13 or 14, wherein the uneven structure is formed by subjecting a thermoplastic material to an imprint or subjecting a photoresist material to photolithography.

(Supplementary Note 16)

The transparent resin layer according to any one of Supplementary Notes 1 to 15, being a sheet or a film having at least either a light-scattering function or a light dispersion function.

(Supplementary Note 17)

The transparent resin layer according to any one of Supplementary Notes 1 to 16, for use in an organic EL lighting panel.

(Supplementary Note 18)

The transparent resin layer according to any one of Supplementary Notes 1 to 16, for use in an organic EL display panel.

(Supplementary Note 19)

An organic EL panel including:
a substrate; and
at least one transparent resin layer according to any one of Supplementary Notes 1 to 18, wherein
the at least one transparent resin layer is laminated on at least one surface of the substrate.

(Supplementary Note 20)

The organic EL panel according to Supplementary Note 19, wherein the substrate is a glass substrate.

(Supplementary Note 21)

The organic EL panel according to Supplementary Note 19 or 20, further including a transparent electrode.

(Supplementary Note 22)

The organic EL panel according to Supplementary Note 21, wherein the transparent electrode is formed of at least one selected from the group consisting of a metal oxide, an oxide semiconductor, a silver nanowire, and a carbon material.

(Supplementary Note 23)

The organic EL panel according to Supplementary Note 21 or 22, wherein the transparent electrode is formed of at least one selected from the group consisting of Indium-Tin Oxide (ITO), Indium-Zinc Oxide (IZO), zinc oxide (ZnO), a silver nanowire, graphene, and a carbon nanotube.

(Supplementary Note 24)

The organic EL panel according to Supplementary Note 21, wherein the transparent electrode is an Indium-Tin Oxide (ITO) electrode.

(Supplementary Note 25)

The organic EL panel according to any one of Supplementary Notes 21 to 24, wherein the at least one transparent resin layer is disposed between the substrate and the transparent electrode.

(Supplementary Note 26)

The organic EL panel according to Supplementary Note 25, wherein the at least one transparent resin layer is the transparent resin layer according to any one of Supplementary Notes 1 to 12, and the light-scattering fine particles of the first fine particle group have an average particle diameter from 300 to 3000 nm.

(Supplementary Note 27)

The organic EL panel according to any one of Supplementary Notes 21 to 24, wherein the at least one transparent resin layer is disposed on one surface of the substrate to interpose the substrate between the at least one transparent resin layer and the transparent electrode.

(Supplementary Note 28)

The organic EL panel according to any one of Supplementary Notes 21 to 24, wherein the at least one transparent resin layer includes a plurality of transparent resin layers, at least one of the plurality of transparent resin layers is disposed on one surface of the substrate to be interposed between the substrate and the transparent electrode, and at least another one of the plurality of transparent resin layers is disposed on the other surface of the substrate to interpose the substrate between the at least one of the plurality of transparent resin layers and the at least another one of the plurality of transparent resin layers.

(Supplementary Note 29)

The organic EL panel according to Supplementary Note 28, wherein the at least one of the plurality of transparent resin layers is the transparent resin layer according to any one of Supplementary Notes 1 to 12, and the at least another one of the plurality of transparent resin layers is the transparent resin layer according to any one of Supplementary Notes 13 to 18.

(Supplementary Note 30)

The organic EL panel according to Supplementary Note 28, wherein the at least one of the plurality of transparent resin layers is the transparent resin layer according to any one of Supplementary Notes 13 to 18, and the at least another one of the plurality of transparent resin layers is the transparent resin layer according to any one of Supplementary Notes 1 to 12.

(Supplementary Note 31)

The organic EL panel according to any one of Supplementary Notes 19 to 30, being an organic EL lighting panel including the transparent resin layer according to Supplementary Note 17.

(Supplementary Note 32)

The organic EL panel according to any one of Supplementary Notes 19 to 30, being an organic EL display panel including the transparent resin layer according to Supplementary Note 18.

(Supplementary Note 33)

An organic EL lighting device including the transparent resin layer according to Supplementary Note 17 or the organic EL lighting panel according to Supplementary Note 31.

(Supplementary Note 34)

An organic EL panel including:

a substrate;

a sealing substrate facing the substrate; and the transparent resin layer according to any one of Supplementary Notes 1 to 18, wherein the transparent resin layer is disposed on one surface of the sealing substrate to interpose the sealing substrate between the transparent resin layer and the substrate.

(Supplementary Note 35)

An organic EL panel including:

a substrate;

a sealing substrate facing the substrate; and a plurality of the transparent resin layers according to any one of Supplementary Notes 1 to 18, wherein at least one of the plurality of the transparent resin layers is disposed on one surface of the sealing substrate to interpose the sealing substrate between the at least one of the plurality of the transparent resin layers and the substrate, and at least another one of the plurality of the transparent resin layers is disposed on at least one surface of the substrate.

(Supplementary Note 36)

The organic EL panel according to Supplementary Note 35, further including a transparent electrode.

(Supplementary Note 37)

The organic EL panel according to Supplementary Note 36, wherein the at least another one of the plurality of the transparent resin layers is disposed to be interposed between the substrate and the transparent electrode.

(Supplementary Note 38)

The organic EL panel according to Supplementary Note 36, wherein the at least another one of the plurality of the transparent resin layers is disposed on one surface of the substrate to interpose the substrate between the at least another one of the plurality of the transparent resin layers and the transparent electrode.

(Supplementary Note 39)

The organic EL panel according to Supplementary Note 36, wherein the at least another one of the plurality of the transparent resin layers includes a plurality of transparent resin layers, at least one of the plurality of transparent resin layers is disposed on one surface of the substrate to be interposed between the substrate and the transparent electrode, and at least another one of the plurality of transparent resin layers is disposed on the other surface of the substrate to interpose the substrate between at least one of the plurality of transparent resin layers and the at least another one of the plurality of transparent resin layers.

(Supplementary Note 40)

An organic EL display including the transparent resin layer according to Supplementary Note 18 or the organic EL display panel according to Supplementary Note 32.

(Supplementary Note 41)

The organic EL display according to Supplementary Note 40 including the organic EL lighting panel according to Supplementary Note 32, wherein the organic EL lighting panel is the organic EL panel according to Supplementary Note 27, and the transparent resin layer is disposed on the visible side of the substrate, and the transparent electrode is disposed on the opposite side of the visible side.

(Supplementary Note 42)

The organic EL display according to Supplementary Note 41, wherein the visible side of transparent resin layer is sealed with a sealing substrate.

(Supplementary Note 43)

A method for adjusting the color temperature of an organic EL panel, including: in production of the transparent resin layer according to any one of Supplementary Notes 1 to 12, increasing the content of the light-scattering fine particles of the second fine particle group in the total mass of the light-scattering fine particles of the first and second fine particle groups to increase the color temperature of the organic EL panel or reducing the content of the light-scattering fine particles of the second fine particle group in the total mass of the light-scattering fine particles of the first and second fine particle groups to reduce the color temperature of the organic EL panel.

(Supplementary Note 44)

A method for adjusting the color temperature of an organic EL panel, including, in production of the transparent resin layers according to any one of Supplementary Notes 13 to 18, increasing the proportion of the bottom areas of the projections of the second projection group in the sum of the bottom areas of the projections of the first and second projection groups to increase the color temperature of the organic EL panel or reducing the proportion of the bottom areas of the projections of the second projection group in the sum of the bottom areas of the projections of the first and second projection groups to reduce the color temperature of the organic EL panel.

This application is based upon and claims the benefit of priority from Japanese patent application No. 2014-138652, filed on Jul. 4, 2014, the disclosure of which is incorporated herein its entirety by reference.

EXPLANATION OF REFERENCE NUMERALS 10, 20, 30, 40, 50, 60, 70, 90, 100 organic EL panel
11 substrate
12, 22, 32, 42 transparent resin layer for use in organic EL panel
13 planarizing layer
14 transparent electrode (anode)
15 cathode
16 organic EL layer
61 sealing substrate
62 filler
63 sealing part
161 hole injection layer
162 hole transport layer
163 light-emitting layer
164 electron transport layer
165 electron injection layer
121, 221 transparent resin (binder resin, matrix resin)
122 first fine particle
123 second fine particle
222, 422, 81 first projection
223, 423, 82 second projection
101, 102, 111, 112, 113 light emitted in the front direction of organic EL panel (front side of transparent substrate 11) or a direction close thereto
103, 104 light emitted in the direction largely tilted with respect to the front direction
114, 117 red light
115, 118 green light
116, 119 blue light
601, 701, 801 light

What is claimed is:

1. A light-scattering layer for use in an organic EL panel, comprising:
a transparent resin layer; and
a planarizing layer,
wherein the transparent resin layer comprises:
a transparent resin; and
a plurality of light-scattering particles dispersed in the transparent resin without protruding from a surface of the transparent resin, wherein
the plurality of light-scattering fine particles comprises:
a first fine particle group comprising light-scattering particles having an average particle diameter from 300 to 50000 nm; and
a second fine particle group comprising light-scattering particles having an average particle diameter from 1 to 300 nm, and
wherein a refractive index of the planarizing layer is higher than a refractive index of the transparent resin layer.

2. The light scattering layer according to claim 1, wherein the content of the light-scattering particles of the second fine particle group is in the range from 1% to 30% by mass in the total mass of the light-scattering fine particles in the first and second fine particle groups.

3. The light-scattering layer according to claim 1, wherein the light-scattering fine particles are at least either organic fine particles or inorganic particles.

4. A light-scattering layer for use in an organic EL panel, comprising:
a transparent resin layer; and
a planarizing layer,
wherein the transparent resin layer comprises:
a transparent resin; and
an uneven structure formed in the transparent resin without protruding from a surface of the transparent resin, the uneven structure comprising a plurality of projections,
wherein the plurality of projections comprises:
a first projection group comprising projections, at least either the widths or the heights of the projections of the first projection group being in the range from 300 to 3000 nm, and
a second projection group comprising projections, at least either the widths or the heights of the projections of the second projection group being in the range from 10 to 300 nm, and
wherein at least either the shapes or the sizes of the plurality of projections in the uneven structure have no periodicity, and
wherein a refractive index of the planarizing layer is higher than a refractive index of the transparent resin layer.

5. The light-scattering layer according to claim 4, wherein the proportion of the bottom areas of the projections in the second projection group is in the range from 1% to 30% in the sum of the bottom areas of the projections in the first and second projection groups.

6. An organic EL panel comprising:
a substrate; and
at least one light-scattering layer according to claim 1 or 4, wherein
the at least one light-scattering layer is laminated on at least one surface of the substrate.

7. The organic EL panel according to claim 6, further comprising:
a transparent electrode, wherein
the at least one light-scattering layer is disposed on one surface of the substrate to be interposed between the substrate and the transparent electrode, or
the at least one light-scattering layer is disposed on the other surface of the substrate to interpose the substrate between the at least one light-scattering layer and the transparent electrode.

8. The organic EL panel according to claim 7, wherein
the at least one light-scattering layer comprises a plurality of transparent resin layers,
at least one of the plurality of transparent resin layers is disposed on one surface of the substrate to be interposed between the substrate and the transparent electrode, and
at least another one of the plurality of the transparent resin layers is disposed on the other surface of the substrate to interpose the substrate between the at least one of the plurality of transparent resin layers and the at least another one of the plurality of the transparent resin layers.

9. An organic EL lighting device comprising:
the light-scattering layer according to claim 1 or 4.

10. An organic EL display comprising:
the light-scattering layer according to claim 1 or 4.

* * * * *